(12) United States Patent
Furuta et al.

(10) Patent No.: US 8,971,478 B2
(45) Date of Patent: Mar. 3, 2015

(54) SHIFT REGISTER, SIGNAL LINE DRIVE CIRCUIT, LIQUID CRYSTAL DISPLAY DEVICE

(75) Inventors: Shige Furuta, Osaka (JP); Yuhichiroh Murakami, Osaka (JP); Yasushi Sasaki, Osaka (JP); Takahiro Yamaguchi, Osaka (JP); Seijirou Gyouten, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 186 days.

(21) Appl. No.: 13/575,490

(22) PCT Filed: Feb. 10, 2011

(86) PCT No.: PCT/JP2011/052919
§ 371 (c)(1),
(2), (4) Date: Jul. 26, 2012

(87) PCT Pub. No.: WO2011/105229
PCT Pub. Date: Sep. 1, 2011

(65) Prior Publication Data
US 2012/0306829 A1   Dec. 6, 2012

(30) Foreign Application Priority Data
Feb. 23, 2010   (JP) .................................. 2010-037685

(51) Int. Cl.
*G11C 19/00*   (2006.01)
*G11C 19/28*   (2006.01)
*G09G 3/36*   (2006.01)

(52) U.S. Cl.
CPC .............. *G11C 19/28* (2013.01); *G09G 3/3677* (2013.01)

USPC ........................................................... 377/64

(58) Field of Classification Search
None
See application file for complete search history.

(56) References Cited

U.S. PATENT DOCUMENTS

| 5,282,234 A | 1/1994 | Murayama et al. |
| 5,625,303 A * | 4/1997 | Jamshidi ...................... 326/106 |
| 6,724,361 B1 | 4/2004 | Washio et al. |
| 6,765,980 B2 * | 7/2004 | Azuma et al. .................. 377/69 |

(Continued)

FOREIGN PATENT DOCUMENTS

| JP | 2-027597 A | 1/1990 |
| JP | 4-022922 A | 1/1992 |

(Continued)

OTHER PUBLICATIONS

International Search Report and Written Opinion.
Extended European Search Report dated Nov. 25, 2013.

*Primary Examiner* — Tuan T Lam
(74) *Attorney, Agent, or Firm* — Harness, Dickey & Pierce

(57) ABSTRACT

A shift register includes a plurality of stages of unit circuits each including a flip-flop. Each of the unit circuits generates, by obtaining a sync signal in accordance with an output from the flip-flop, an output signal. The flip-flop includes a first switch and a second switch and a latch circuit for latching a signal supplied thereto and outputting the signal as the output from the flip-flop. A first shift direction signal is supplied to the latch circuit via the first switch, and the second shift direction signal is supplied to the latch circuit via the second switch. In each unit circuit other than those of the first and last stages, an output signal from a previous stage is supplied to a control terminal of the first switch, and an output signal from a subsequent stage is supplied to a control terminal of the second switch.

3 Claims, 34 Drawing Sheets

(56) References Cited

U.S. PATENT DOCUMENTS

| | | | |
|---|---|---|---|
| 7,327,161 B2* | 2/2008 | Jang et al. | 326/46 |
| 2004/0150610 A1* | 8/2004 | Zebedee et al. | 345/100 |
| 2005/0084059 A1 | 4/2005 | Yu | |
| 2006/0269038 A1* | 11/2006 | Jang et al. | 377/64 |
| 2007/0115245 A1 | 5/2007 | Nakao et al. | |
| 2007/0262976 A1 | 11/2007 | Matsuda et al. | |
| 2008/0012818 A1* | 1/2008 | Lee et al. | 345/100 |
| 2008/0219401 A1 | 9/2008 | Tobita | |
| 2009/0262884 A1* | 10/2009 | Chen | 377/64 |
| 2011/0007040 A1* | 1/2011 | John et al. | 345/204 |

FOREIGN PATENT DOCUMENTS

| | | |
|---|---|---|
| JP | 4-369920 A | 12/1992 |
| JP | 6-021778 A | 1/1994 |
| JP | 2001135093 A | 5/2001 |
| JP | 2005-129211 A | 5/2005 |
| JP | 2005-228459 A | 8/2005 |
| JP | 2007-140197 A | 6/2007 |
| WO | WO-2006/040904 A1 | 4/2006 |
| WO | WO 2009/130989 | 10/2009 |

* cited by examiner

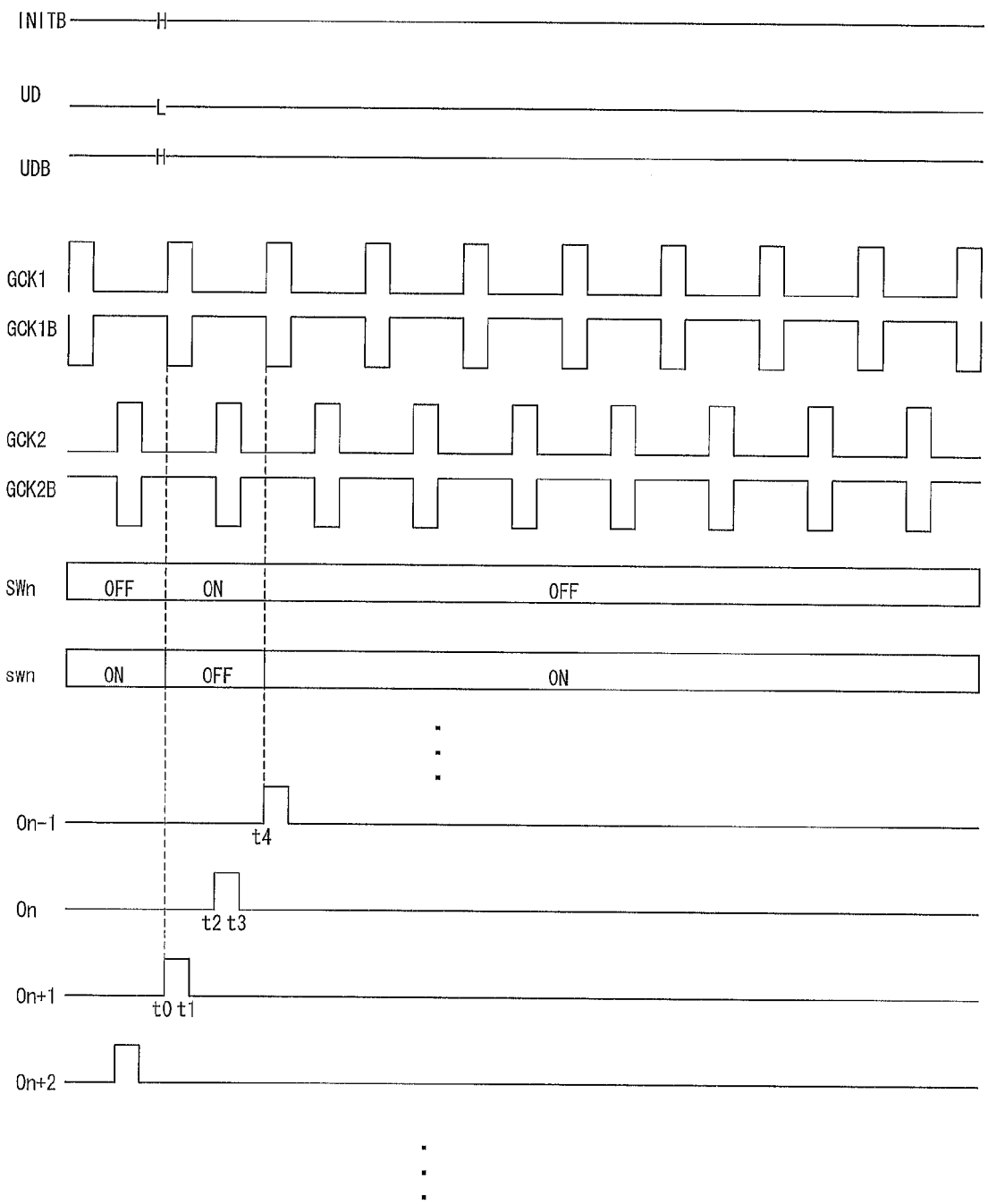

SHIFT REGISTER, SIGNAL LINE DRIVE CIRCUIT, LIQUID CRYSTAL DISPLAY DEVICE

TECHNICAL FIELD

The present invention relates to a shift register whose shift direction is switchable.

BACKGROUND ART

FIG. 31 shows a conventional configuration of a gate driver whose scanning direction is switchable. The gate deriver includes an INITB (inversion initialization signal) line, a GCK1B (first inverted gate clock) line, a GCK2B (second inverted gate clock) line, A UD (shift direction signal) line, a UDB (inverted shift direction signal) line, and a shift register 100 (conventional shift register) constituted by unit circuits of first to mth stages (m is an integer of 2 or greater). The INITB (inversion initialization signal) is "Low" when it is in an active state.

For example, a unit circuit Cn of the nth stage (n is an integer of 2 or greater) includes a flip-flop fn, two analog switches SWn and swn, an inverter IBn, and a driving terminal Un serving as a connection terminal for connection with a scanning signal line. The flip-flop fn has A to D terminals and X and Y terminals which serve as input terminals, and has a Q terminal (output terminal) and a QB terminal (inverting output terminal) which serve as output terminals. Each of the analog switches SWn and SWn is a CMOS switch constituted by a single P channel transistor and a single N channel transistor, and has a P terminal which is a gate terminal of the P channel transistor, an N terminal which is a gate terminal of the N channel transistor, and two conducting terminals.

The unit circuit Cn is configured such that: the Q terminal of the flip-flop fn, the N terminal of the analog switch SWn, and the P terminal of the analog switch swn are connected with one another; the QB terminal of the flip-flop fn, the P terminal of the analog switch SWn, and the N terminal of the analog switch swn are connected with one another; one of the conducting terminals of the analog switch SWn, one of the conducting terminals of the analog switch swn, and an input terminal of the inverter IBn are connected with one another; an output terminal of the inverter IBn is connected with the driving terminal Un; the other of the conducting terminals of the analog switch swn is connected with the INITB line; and the other of the conducting terminals of the analog switch SWn is connected with the GCK2B line.

The A terminal of the flip-flop fn is connected with a driving terminal Un−1 of a previous stage Cn−1, the B terminal of the flip-flop fn is connected with an input terminal of an inverter IBn−1 of the previous stage Cn−1, the C terminal of the flip-flop fn is connected with a driving terminal Un+1 of a subsequent stage Cn+1, the D terminal of the flip-flop fn is connected with an input terminal of an inverter IBn+1 of the subsequent stage Cn−1, the X terminal of the flip-flop fn is connected with the UD line, and the Y terminal of the flip-flop fn is connected with the UDB line.

FIG. 32 shows a specific circuit configuration of the flip-flop fn. As illustrated in FIG. 32, the flip-flop fn includes four analog switches 71 to 74 (each of which has the same configuration as in the analog switch SWn), a P channel transistor 78, an N channel transistor 79, and two inverters 75 and 76. The flip-flop fn is configured such that: the B terminal is connected with a gate terminal of the transistor 78 via the analog switch 71; the D terminal is connected with the gate terminal of the transistor 78 via the analog switch 72; the A terminal is connected with a gate terminal of the transistor 79 via the analog switch 73; the C terminal is connected with the gate terminal of the transistor 79 via the analog switch 74; an N terminal of the analog switch 71, a P terminal of the analog switch 72, a P terminal of the analog switch 73, an N terminal of the analog switch 74, and the X terminal are connected to one another; a P terminal of the analog switch 71, a P terminal of the analog switch 74, and the Y terminal are connected with one another; a source terminal of the transistor 78 is connected with a high-voltage power supply VDD; and a source terminal of the transistor 79 is connected with a low-voltage power supply VSS. Further, a drain terminal of the transistor 78, a drain terminal of the transistor 79, an input terminal of the inverter 75, and an output terminal of the inverter 76, and the Q terminal are connected with one another. An output terminal of the inverter 75, an input terminal of the inverter 76, and the QB terminal are connected with one another. The inverters 75 and 76 constitute a latch circuit.

FIG. 33 is a timing chart showing operations of the gate driver shown in FIG. 31. In FIG. 33, the UD is "High" (hereinafter referred to as "H" for short) and the UDB is "Low" (hereinafter referred to as "L" for short). Therefore, the analog switches 72 and 73 are in an OFF state, and the analog switches 71 and 74 are in an ON state. When On−1 becomes "H" while On+1 is "L" at t0, the B terminal is "L" and the C terminal is also "L". This updates the latch circuit, and the Q terminal becomes "H" and the QB terminal becomes "L". This turns ON the analog switch SWn and turns OFF the analog switch swn. From this point in time, an inverted version (GCK2) of the GCK2B is outputted as On. That is, the On rises to "H" at t2, and falls to "L" at t3.

When On+1 becomes "H" while On−1 is "L" at t4, the B terminal is "H" and the C terminal also is "H". This updates the latch circuit, and the Q terminal becomes "L" and the QB terminal becomes "H". This turns OFF the analog switch SWn and turns ON the analog switch swn. From this point in time, an inverted version of the INITB is outputted as On. That is, the On is "L" at and after the t4. As described above, according to FIG. 33, On−1, On, and On+1 become active "H" in this order, thereby enabling forward scanning. Note that, in FIG. 34, since the UD is "L" and the UDB is "H", On+1, On, and On−1 become active "H" in this order, thereby enables reverse scanning.

CITATION LIST

Patent Literatures

Patent Literature 1
International Publication WO2006/040904 (Publication Date: Apr. 20, 2006)
Patent Literature 2
Japanese Patent Application Publication, Tokukai, No. 2001-135093 A (Publication Date: May 18, 2001)

SUMMARY OF INVENTION

Technical Problem

However, the foregoing conventional shift register includes many elements, and is thus difficult to be reduced in size and cost.

An object of the present invention is to reduce the number of elements of a shift register whose shift direction is switchable, thereby reducing the size and cost of the shift register.

Solution to Problem

A shift register of the present invention includes a plurality of stages of unit circuits each including a flip-flop, a shift direction of the shift register being switchable by a first shift direction signal and a second shift direction signal, wherein: each of the unit circuits generates, by obtaining a sync signal in accordance with an output from the flip-flop, an output signal to be outputted from a current stage, the flip-flop includes (i) a first switch and a second switch and (ii) a latch circuit for latching a signal supplied thereto and outputting the signal as the output from the flip-flop, the first shift direction signal is supplied to the latch circuit via the first switch, and the second shift direction signal is supplied to the latch circuit via the second switch, and in each unit circuit other than those of the first and last stages, an output signal from a previous stage is supplied to a control terminal of the first switch, and an output signal from a subsequent stage is supplied to a control terminal of the second switch.

According to the shift register, in the case of forward shifting, when the previous stage becomes active and thus the first shift direction signal is supplied to the latch circuit, the output from the flip-flop becomes active and is maintained active until the subsequent stage becomes active and thus the second shift direction signal is supplied to the latch circuit. On the other hand, in the case of reverse shifting, when the subsequent stage becomes active and thus the second shift direction signal is supplied to the latch circuit, the output from the flip-flop becomes active and is maintained active until the previous stage becomes active and thus the first shift direction signal is supplied to the latch circuit.

As described above, according to the configuration, it is possible to achieve, with use of less elements than a conventional technique, a shift register whose shift direction is switchable. This makes it possible to reduce the size and cost of the bidirectional shift register.

Advantageous Effects of Invention

The present invention makes it possible to reduce the number of elements of a shift register whose shift direction is switchable, and thus possible to reduce the size and cost of the shift register.

BRIEF DESCRIPTION OF DRAWINGS

FIG. 34 is a timing chart showing operations of the gate driver shown in FIG. 31 (in the case of reverse shifting).

DESCRIPTION OF EMBODIMENTS

The following description discusses embodiments of the present invention with reference to FIGS. 1 to 30.

Embodiment 1

Figure 1:
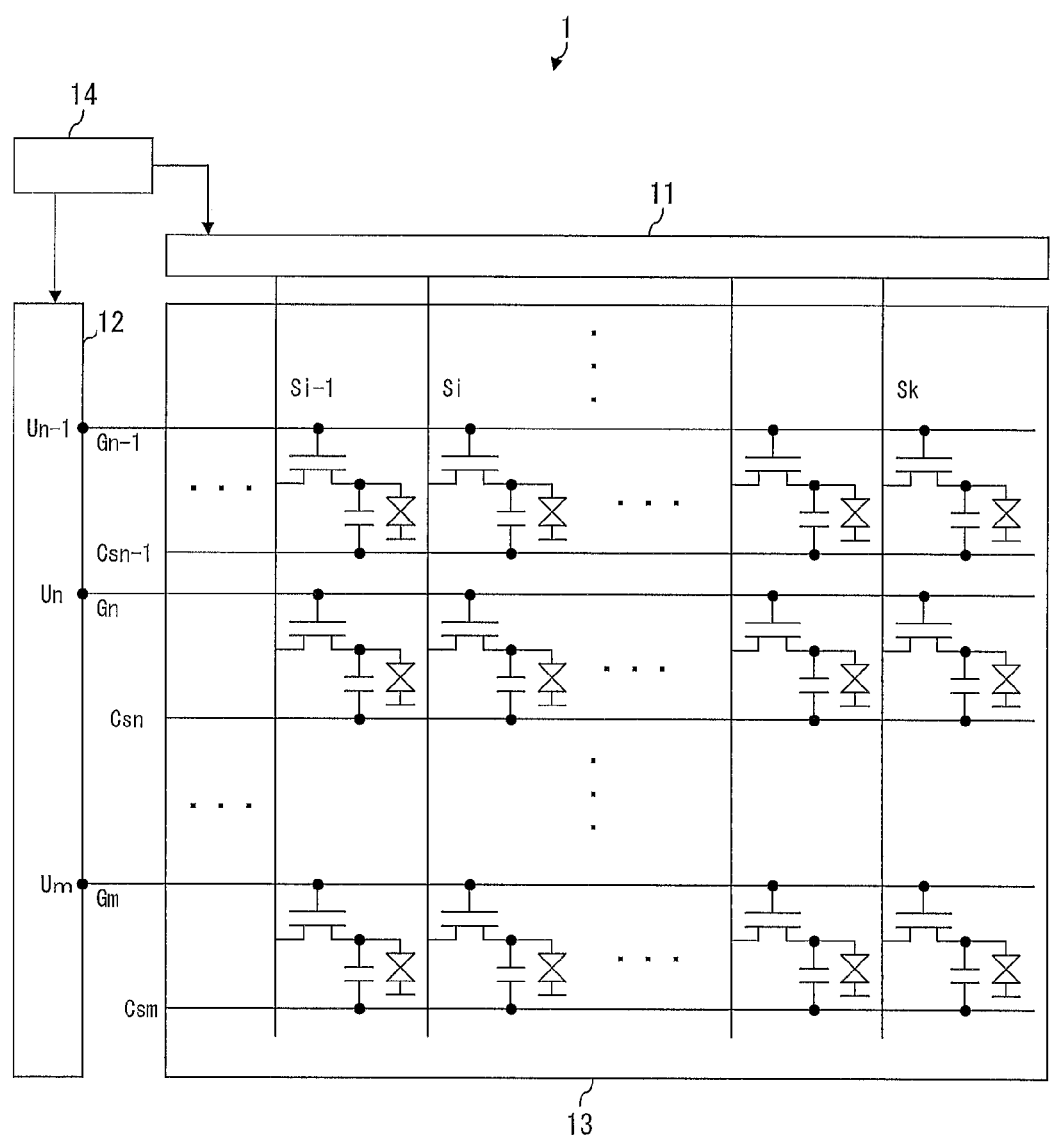
FIG. 1 is a circuit block diagram illustrating a configuration of a liquid crystal display device in accordance with embodiments of the present invention.

FIG. 1 is a block diagram illustrating a configuration of a liquid crystal display device 1 of the present embodiment. As illustrated in FIG. 1, the liquid crystal display device 1 includes a source driver 11, a gate driver 12, a liquid crystal panel 13, and a display control circuit 14. The liquid crystal panel 13 is provided with scanning signal lines (Gn−1, Gn, Gm), data signal lines (Si, Sk) and retention capacitor wires (Csn−1, Csn, Csm). The scanning direction of the gate driver is switchable. The gate driver 12 drives each of the scanning signal lines. The source driver 11 drives each of the data signal lines. The display control circuit 14 controls the source driver 11 and the gate driver 12.

Figure 2:
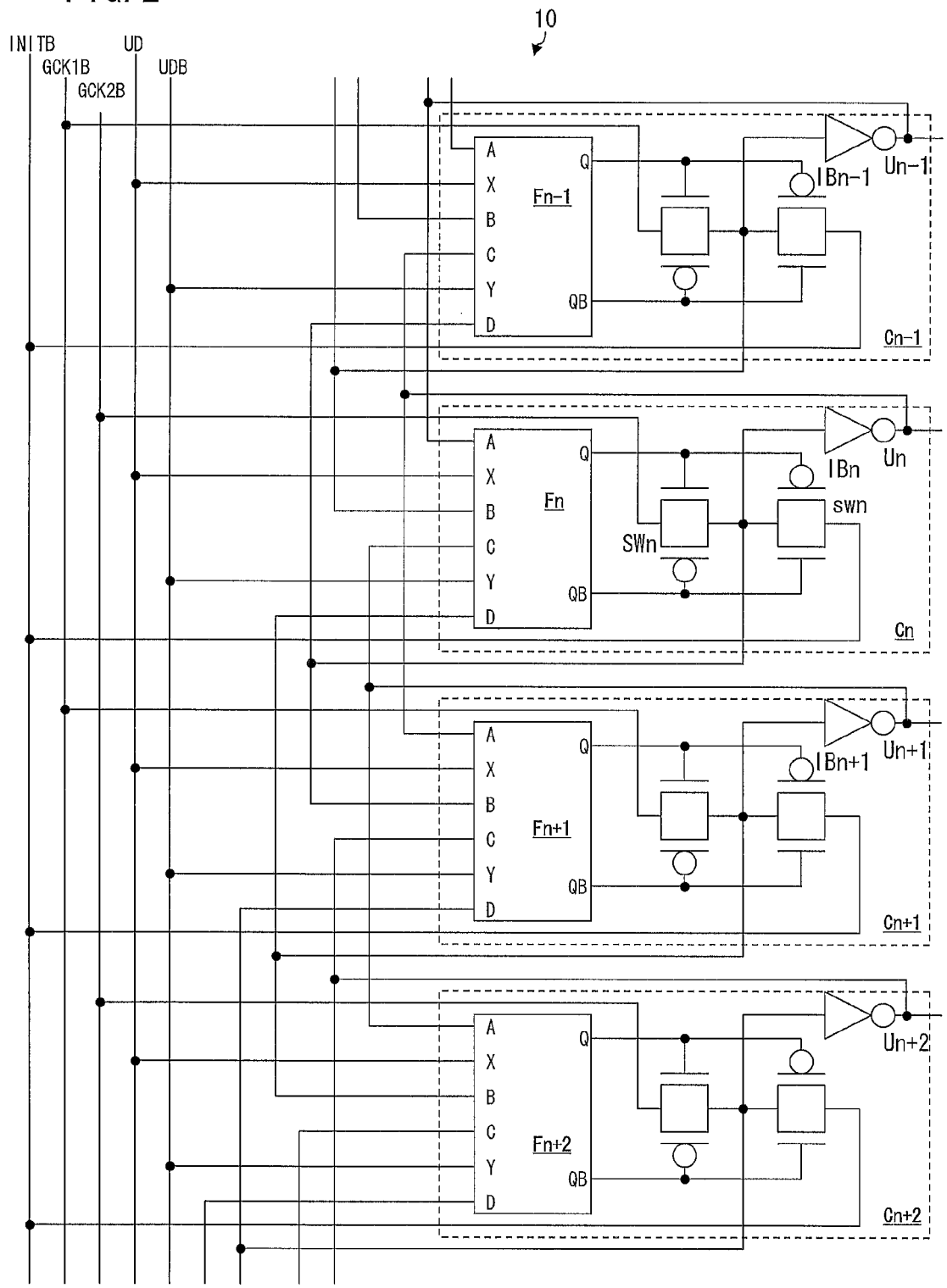
FIG. 2 is a circuit diagram illustrating a configuration of a gate driver in accordance with Embodiment 1.

FIG. 2 is a circuit diagram illustrating a configuration of the gate driver 12 (a gate driver of the present embodiment) shown in FIG. 1. As illustrated in FIG. 2, the gate driver of the present embodiment includes an INITB (inversion initialization signal) line, a GCK1B (first inverted gate clock, sync signal) line, a GCK2B (second inverted gate clock, sync signal) line, a UD (shift direction signal) line, a UDB (inverted shift direction signal) line, and a shift register 10 (shift register of the present embodiment) constituted by the first stage (first stage, unit circuit C1) to the mth stage (last stage, unit circuit Cm).

Note that the GCK1B (first inverted gate clock) and the GCK2B (second inverted gate clock) are two clock signals whose active periods (Low periods) do not overlap. Further, the INITB (inversion initialization signal) is a signal that becomes "Low (active)" at a time of initialization and is "High" in the other periods. Further, the UD (shift direction signal) is a signal that is "High" in a case of forward shifting and is "Low" in a case of reverse shifting. The UDB (inverted shift direction signal) is a signal that is "High" in the case of reverse shifting and is "Low" in the case of forward shifting.

A unit circuit Cn of the nth stage (n is an integer from 1 to m) includes a flip-flop Fn, two analog switches SWn and swn, an inverter IBn, and a driving terminal Un (a node connected with a scanning signal line Gn of the liquid crystal panel).

The flip-flop Fn has A to D terminals and X and Y terminals which serve as input terminals, and a Q terminal (output terminal) and a QB terminal (inverting output terminal) which serve as output terminals. Each of the analog switches SWn and SWn is an analog switch in which (i) one conducting terminal of a P channel transistor is connected with one conducting terminal of an N channel transistor and (ii) the other conducting terminal of the P channel transistor is connected with the other conducting terminal of the N channel transistor. Each of the analog switches SWn and swn has a P terminal which is a gate terminal of the P channel transistor, an N terminal which is a gate terminal of the N channel transistor, and two conducting terminals through which electric currents pass.

The unit circuit Cn, in a case where n is an integer of 2 to m−1, is configured such that: the Q terminal of the flip-flop Fn, the N terminal of the analog switch SWn and the P terminal of the analog switch swn are connected with one another; the QB terminal of the flip-flop Fn, the P terminal of the analog switch SWn, and the N terminal of the analog switch swn are connected with one another; one of the conducting terminals of the analog switch SWn, one of the conducting terminals of the analog switch swn, and an input terminal of the inverter IBn are connected with one another; an output terminal of the inverter IBn is connected with the driving terminal Un; the other of the conducting terminals of the analog switch swn is connected with the INITB line; and the other of the conducting terminals of the analog switch SWn is connected with the GCK2B line (in a case where n is an even number). Further, the A terminal of the flip-flop Fn is connected with a driving terminal Un−1 of a previous stage Cn−1, the B terminal of the flip-flop Fn is connected with an input terminal of an inverter IBn−1 of the previous stage Cn−1, the C terminal of the flip-flop Fn is connected with a driving terminal Un+1 of a subsequent stage Cn+1, the D terminal of the flip-flop Fn is connected with an input terminal of an inverter IBn+1 of the subsequent stage Cn−1, the X terminal of the flip-flop Fn is connected with the UD line, and the Y terminal of the flip-flop Fn is connected with the UDB line.

Figure 3:
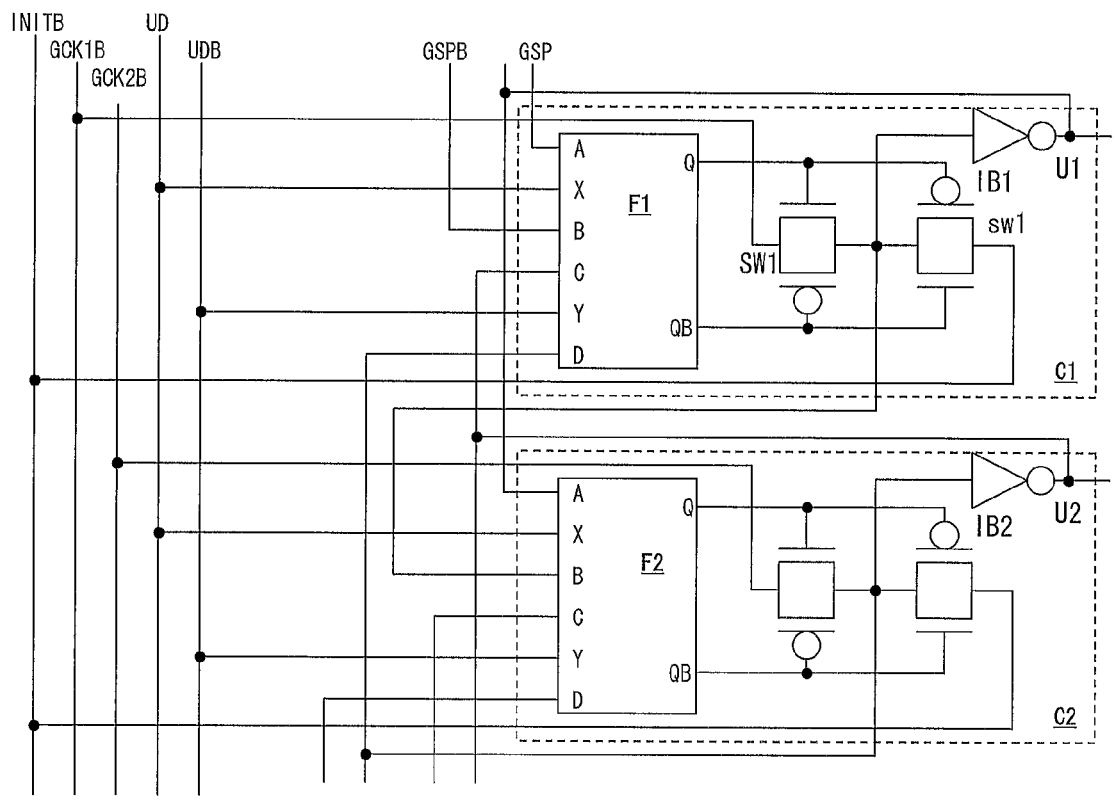
FIG. 3 is a circuit diagram illustrating a configuration (first stage) of the gate driver in accordance with Embodiment 1.
Figure 4:
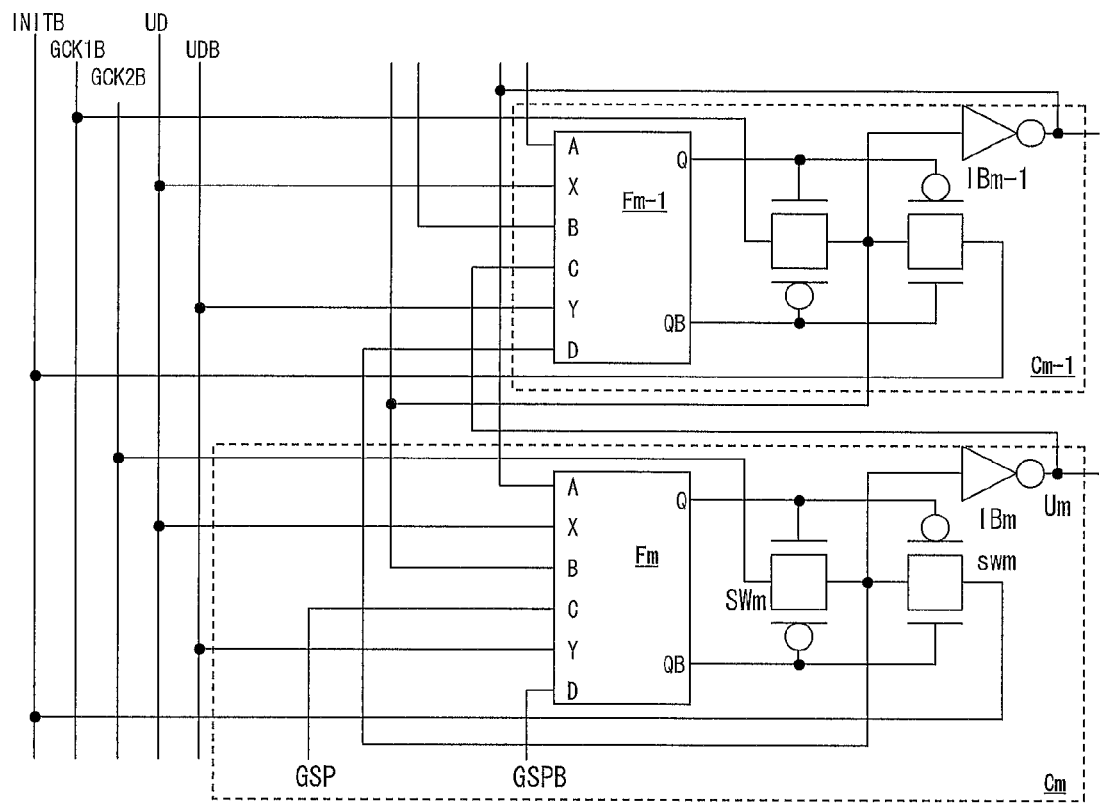
FIG. 4 is a circuit diagram illustrating a configuration (last stage) of the gate driver in accordance with Embodiment 1.

Further, as shown in FIG. 3, a unit circuit C1 (n=1) of the first stage is configured such that: the A terminal of the flip-flop F1 is connected with a GSP (gate start pulse) line; and the B terminal of the flip-flop F1 is connected with a GSPB (inverted gate start pulse) line. The other connections are the same as those in the unit circuits C2 to Cm−1. A unit circuit Cm (n=m) of the last stage is configured such that, as shown in FIG. 4, the C terminal of the flip-flop Fm is connected with the GSP (gate start pulse) line, and the D terminal of the flip-flop Fm is connected with the GSPB (inverted gate start pulse) line. The other connections are the same as those in the unit circuits C2 to Cm−1.

Figure 5:
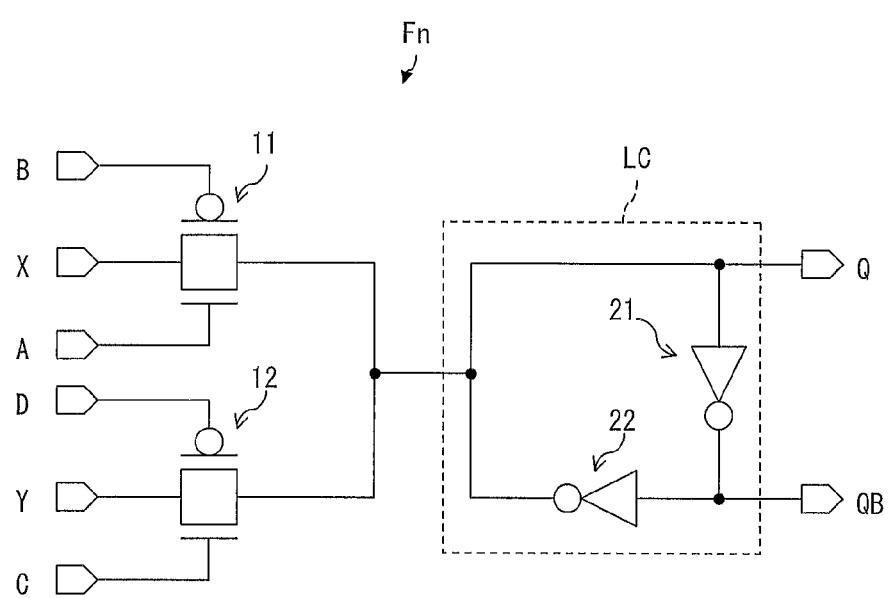
FIG. 5 is a circuit diagram illustrating a configuration of a flip-flop included in the gate driver shown in FIG. 1.

FIG. 5 shows a specific circuit configuration of the flip-flop Fn (n is an integer of 1 to m). As illustrated in FIG. 5, the flip-flop Fn includes analog switches 11 and 12 (each of which has the same configuration as in the analog switch SWn) and inverters 21 and 22. The flip-flop Fn is configured such that: the B terminal is connected with a P terminal of the analog switch 11; the A terminal is connected with an N terminal of the analog switch 11; the D terminal is connected with a P terminal of the analog switch 12; the C terminal is connected with an N terminal of the analog switch 12; the X terminal is connected with an input terminal of the inverter 21 via the analog switch 11; and the Y terminal is connected with an input terminal of the inverter 21 via the analog switch 12. An output terminal of the inverter 21 is connected with an input terminal of the inverter 22, and an output terminal of the inverter 22 is connected with the input terminal of the inverter 21. That is, a latch circuit LC is configured such that an output from the inverter 21 is fed back to the input terminal of the inverter 21 via the inverter 22.

In this way, the unit circuit Cn of the shift register 10 is configured to generate an output signal On of its stage (current stage) by (i) obtaining the INITB (inversion initialization signal) when an output (signals from the Q and QB terminals) from the flip-flop Fn is non-active whereas (ii) obtaining the GCK1B (in a case of an odd-numbered stage) or the GCK2B (in a case of an even-numbered stage) when the output from the flip-flop Fn is active, and to supply the output signal On to the scanning signal line Gn of the liquid crystal panel via the driving terminal Un. The UD (shift direction signal) is supplied to the latch circuit LC via the analog switch 11, and the UDB (inverted shift direction signal) is supplied to the latch circuit LC via the analog switch 12. In each of the flip-flops (i.e., flip-flops F2 to Fm−1) other than those of the first and last stages, an output signal On−1 from a previous stage Cn−1 is supplied to the N terminal of the analog switch 11, and an output signal On+1 from a subsequent stage Cn+1 is supplied to the N terminal of the analog switch 12.

Figure 6:
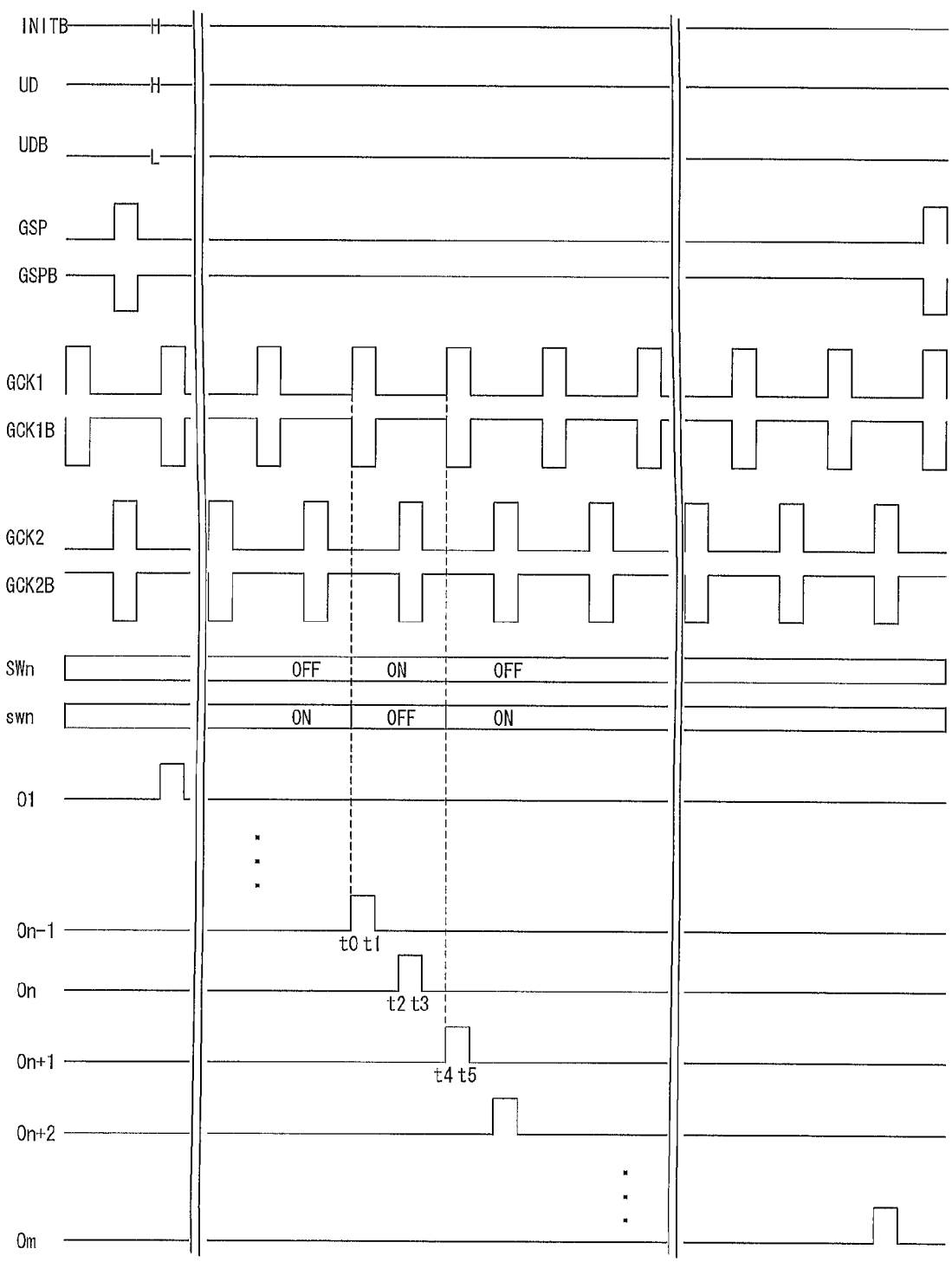
FIG. 6 is a timing chart showing operations of the gate driver shown in FIG. 1 (in the case of forward shifting).

FIG. 6 is a timing chart showing operations of the gate driver of the present embodiment in the case of forward shifting (from the first stage to the last stage). Note that the High state of each signal is referred to as "H" for short, and the Low state of each signal is referred to as "L" for short. In the case of forward shifting, the UD is "H" and the UDB is "L".

When the output signal On−1 from the previous stage becomes "H" at t0, the output signal On+1 from the subsequent stage is "L". Therefore, the A terminal of the flip-flop Fn is "H", the B terminal of the flip-flop Fn is "L", the C terminal of the flip-flop Fn is "L", the D terminal of the flip-flop Fn is "H", and the analog switch 11 of the flip-flop Fn is in the ON state and the analog switch 12 of the flip-flop Fn is in the OFF state. This causes the "H" of the UD to be supplied to the latch circuit LC via the X terminal, thereby the latch circuit is updated and the Q terminal becomes "H" and the QB terminal becomes "L" (that is, the analog switch SWn is turned ON and the analog switch swn is turned OFF). This state is maintained from t0 (even after the output signal On−1 has fallen and the analog switch 11 has been turned OFF) until the next time the latch circuit LC is updated. That is, an inverted version (GCK2) of the GCK2B is supplied to the driving terminal Un of the current stage, and thus the output signal On of the current stage rises to "H" at t2 and falls to "L" at t3.

When the output signal On+1 from the subsequent stage becomes "H" at t4, the output signal On−1 from the previous stage is "L". Therefore, the A terminal of the flip-flop Fn is "L", the B terminal of the flip-flop Fn is "H", the C terminal of the flip-flop Fn is "H", the D terminal of the flip-flop Fn is "L", and the analog switch 11 of the flip-flop Fn is in the OFF state and the analog switch 12 of the flip-flop Fn is in the ON state. This causes the "L" of the UDB to be supplied to the latch circuit LC via the Y terminal, thereby the latch circuit is updated and the Q terminal becomes "L" and the QB terminal becomes "H" (that is, the analog switch SWn is turned OFF and the analog switch swn is turned ON). This state is maintained from t4 (even after the output signal On+1 has fallen and the analog switch 12 has been turned OFF) until the next time the latch circuit LC is updated. That is, an inverted version of the INITB "H" is supplied to the driving terminal Un of the current stage, and thus the output signal On of the current stage is "L" at and after t4. The GSP and GSPB become active before the start of a shifting period, thereby the latch circuit LC of the first stage C1 (from which the shifting starts) is updated and the Q terminal of the F1 becomes "H" and the QB terminal of the F1 becomes "L" (that is, the analog switch SW1 is turned ON and the analog switch sw1 is turned OFF). Further, the GSP and GSPB become active also after the end of the shifting period, thereby the latch circuit LC of the last stage Cm (at which the shifting ends) is updated and the Q terminal of the Fm becomes "L" and the QB terminal of the Fm becomes "H" (that is, the analog switch SWm is turned OFF and the analog switch swm is turned ON).

As described above, according to FIG. 6, the output signal On−1 from the previous stage, the output signal On from the current stage, and the output signal On+1 from the subsequent stage become active "H" in this order, thereby enabling forward shifting.

Figure 7:
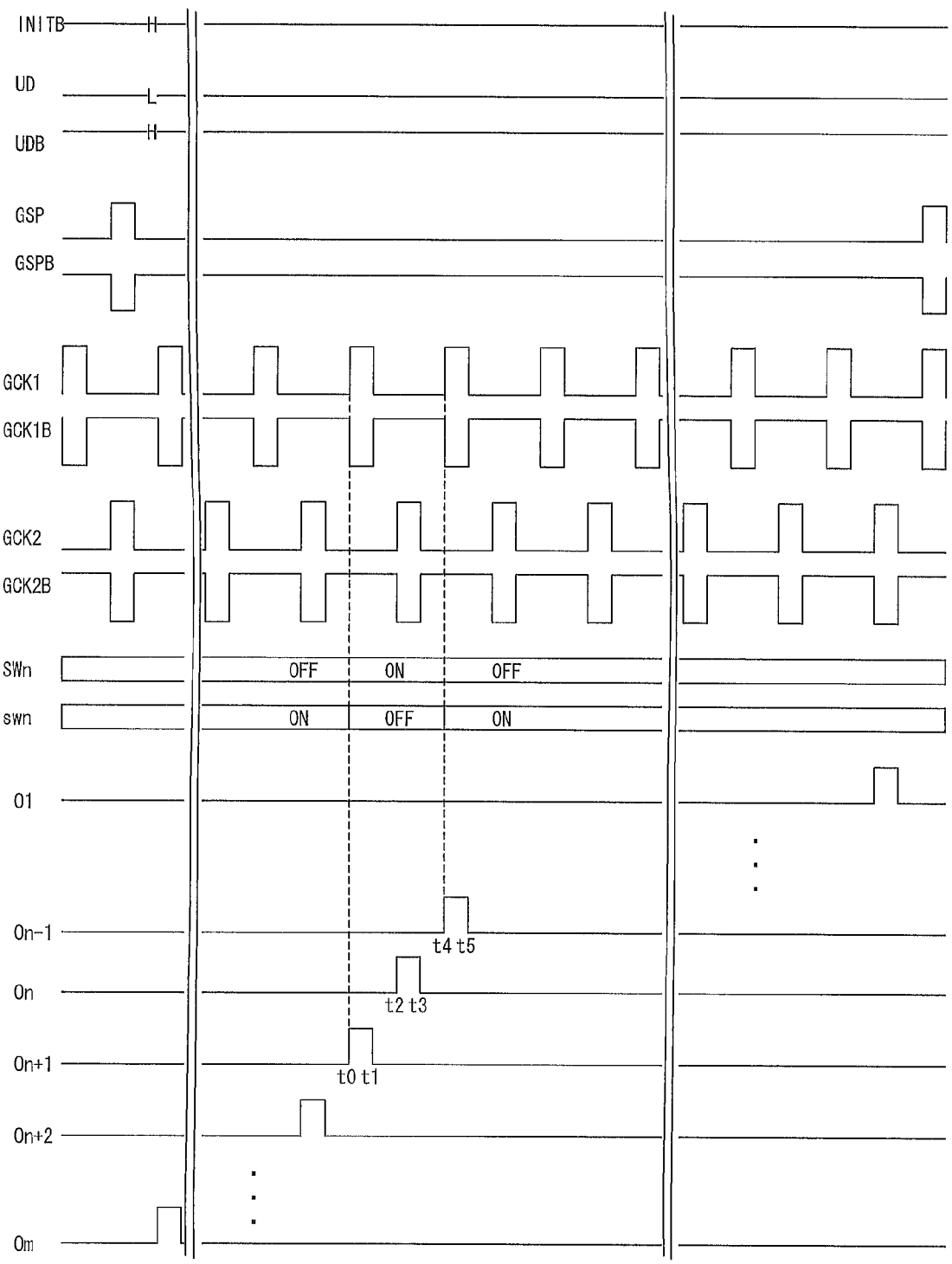
FIG. 7 is a timing chart showing operations of the gate driver shown in FIG. 1 (in the case of reverse shifting).

FIG. 7 is a timing chart showing operations of the gate driver of the present embodiment in the case of reverse shifting (from the last stage to the first stage). In the case of reverse shifting, the UD is "L" and the UDB is "H".

When the output signal On+1 from the subsequent stage becomes "H" at t0, the output signal On−1 from the previous stage is "L". Therefore, the A terminal of the flip-flop Fn is "L", the B terminal of the flip-flop Fn is "H", the C terminal of the flip-flop Fn is "H", the D terminal of the flip-flop Fn is "L", and the analog switch 11 of the flip-flop Fn is in the OFF state and the analog switch 12 of the flip-flop Fn is in the ON state. This causes the "H" of the UDB to be supplied to the latch circuit LC via the Y terminal, thereby the latch circuit is updated and the Q terminal becomes "H" and the QB terminal becomes "L" (that is, the analog switch SWn is turned ON and the analog switch swn is turned OFF). This state is maintained from t0 (even after the output signal On+1 has fallen and the analog switch 12 has been turned OFF) until the next time the latch circuit LC is updated. That is, an inverted version (GCK2) of the GCK2B is supplied to the driving terminal Un of the current stage, and thus the output signal On of the current stage rises to "H" at t2 and falls to "L" at t3.

When the output signal On−1 from the previous stage becomes "H" at t4, the output signal On+1 from the subsequent stage is "L". Therefore, the A terminal of the flip-flop Fn is "H", the B terminal of the flip-flop Fn is "L", the C terminal of the flip-flop Fn is "L", the D terminal of the flip-flop Fn is "H", and the analog switch 11 of the flip-flop Fn is in the ON state and the analog switch 12 of the flip-flop Fn is in the OFF state. This causes the "L" of the UD to be supplied to the latch circuit LC via the X terminal, thereby the latch circuit is updated and the Q terminal becomes "L" and the QB terminal becomes "H" (that is, the analog switch SWn is turned OFF and the analog switch swn is turned ON). This state is maintained from t4 (even after the output signal On−1 has fallen and the analog switch 11 has been turned OFF) until the next time the latch circuit LC is updated. That is, an inverted version of the INITB "H" is supplied to the driving terminal Un of the current stage, and thus the output signal On of the current stage is "L" at and after t4. The GSP and GSPB become active before the start of a shifting period, thereby the latch circuit LC of the last stage Cm (from which the shifting starts) is updated and the Q terminal of the Fm becomes "H" and the QB terminal of the Fm becomes "L" (that is, the analog switch SWm is turned ON and the analog switch swm is turned OFF). Further, the GSP and GSPB become active also after the end of the shifting period, thereby the latch circuit LC of the first stage C1 (at which the shifting ends) is updated and the Q terminal of the F1 becomes "L" and the QB terminal of the F1 becomes "H" (that is, the analog switch SW1 is turned OFF and the analog switch sw1 is turned ON).

As described above, according to FIG. 7, the output signal On+1 from the subsequent stage, the output signal from On from the current stage, and the output signal On−1 from the previous stage become active "H" in this order, thereby enabling reverse shifting.

Figure 31:
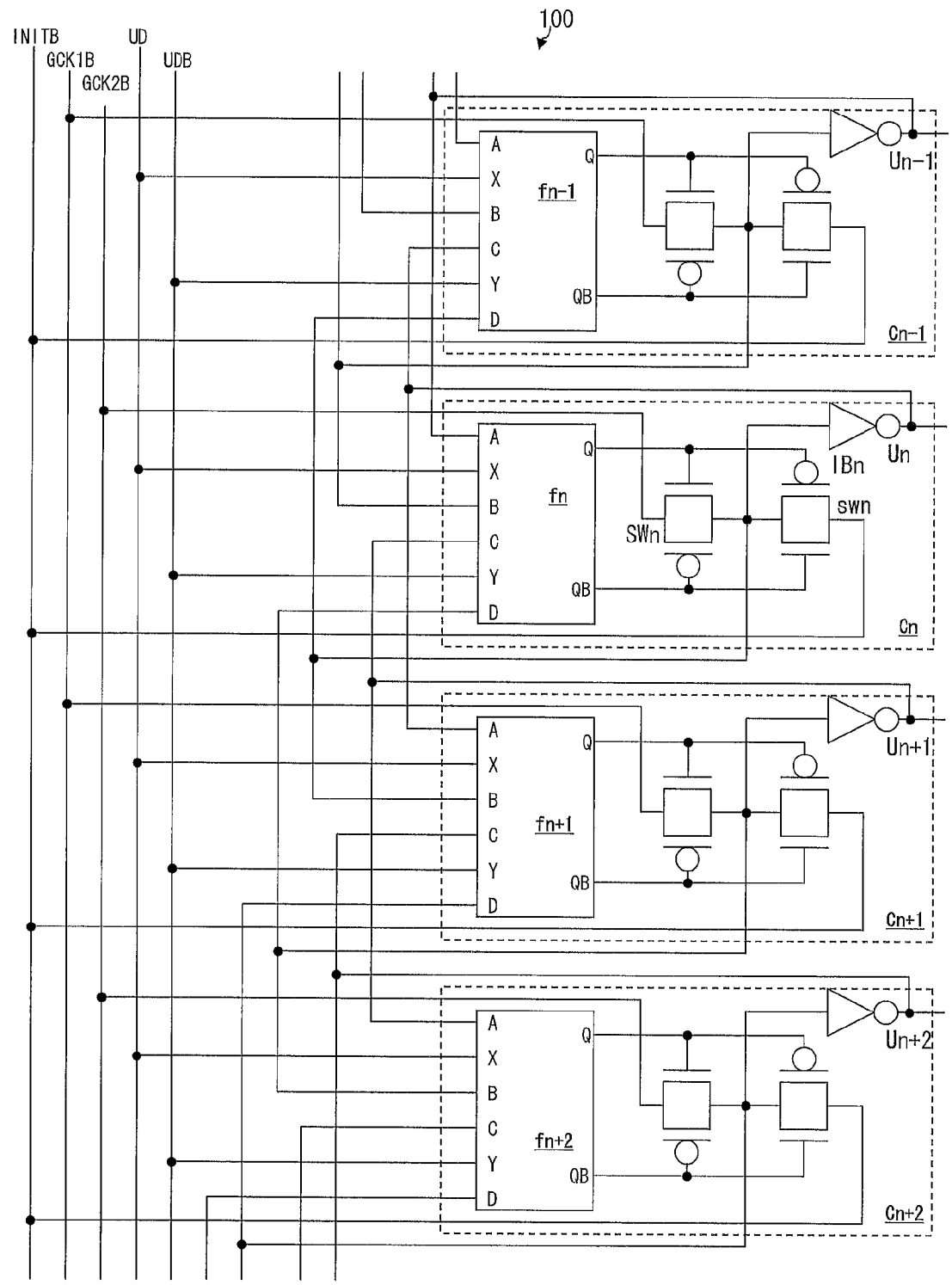
FIG. 31 is a circuit diagram illustrating a configuration of a conventional gate driver.
Figure 32:
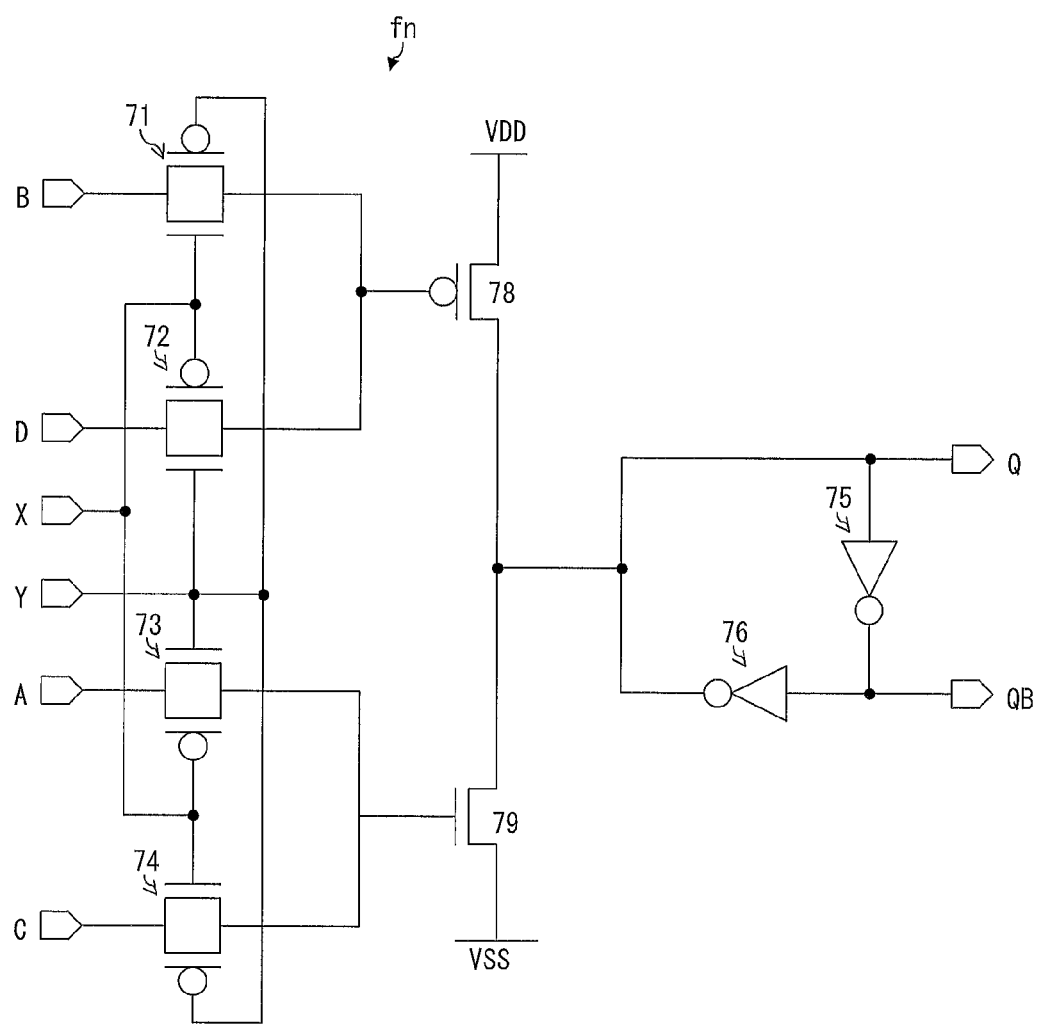
FIG. 32 is a circuit diagram illustrating a configuration of a flip-flop included in the gate driver shown in FIG. 31.
Figure 33:
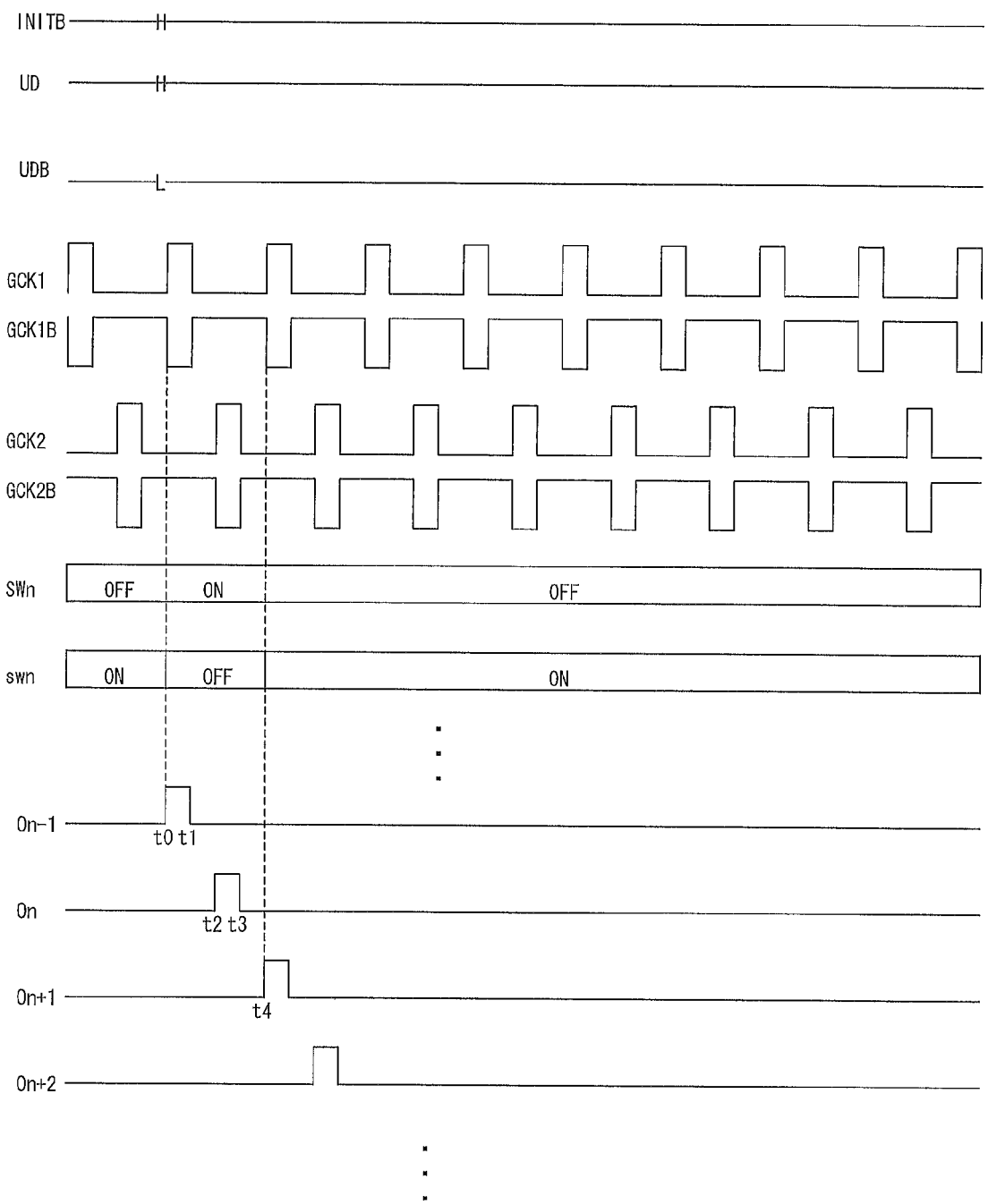
FIG. 33 is a timing chart showing operations of the gate driver shown in FIG. 31 (in the case of forward shifting).

According to the shift register 10, it is possible to reduce the number of elements in the flip-flop as compared to a conventional technique (refer to FIGS. 31 and 32). This makes it possible to achieve a small-size, low-cost bidirectional shift register.

Figure 8:
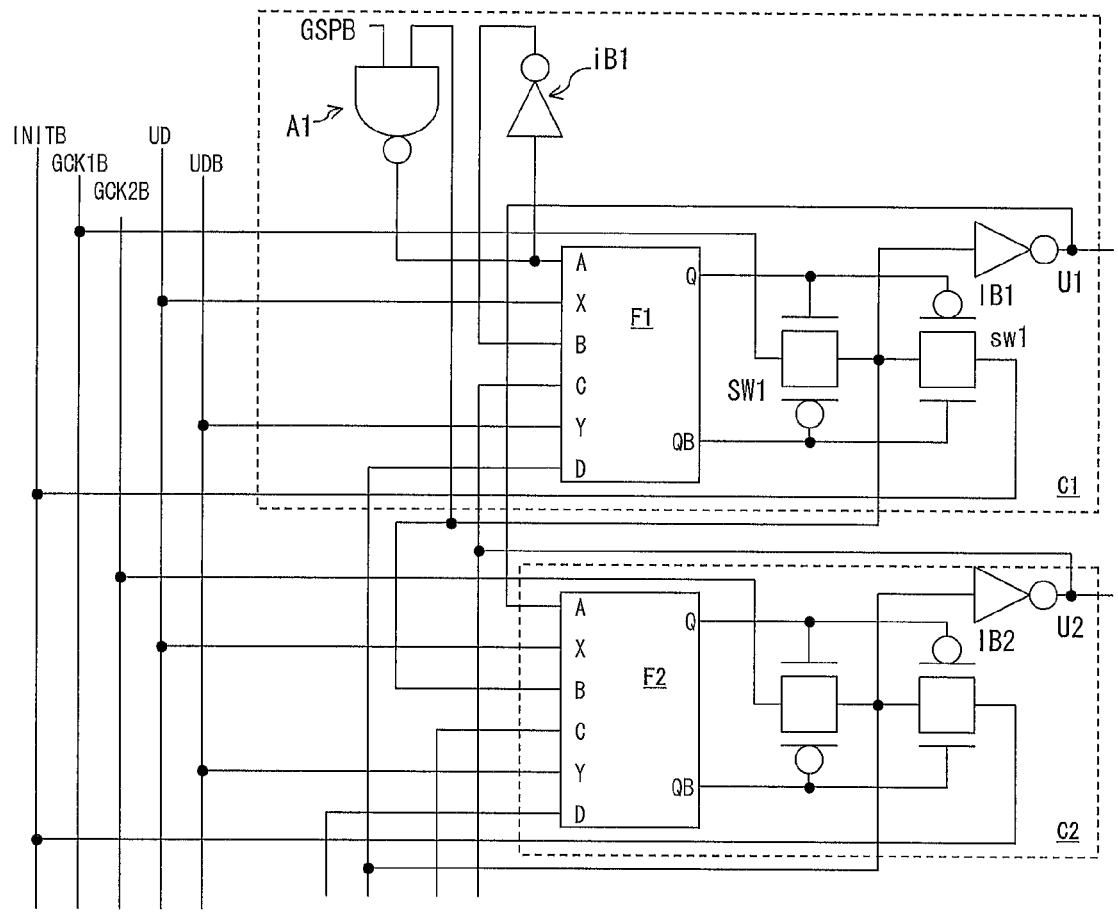
FIG. 8 is a circuit diagram illustrating another configuration (first stage) of the gate driver in accordance with Embodiment 1.
Figure 9:
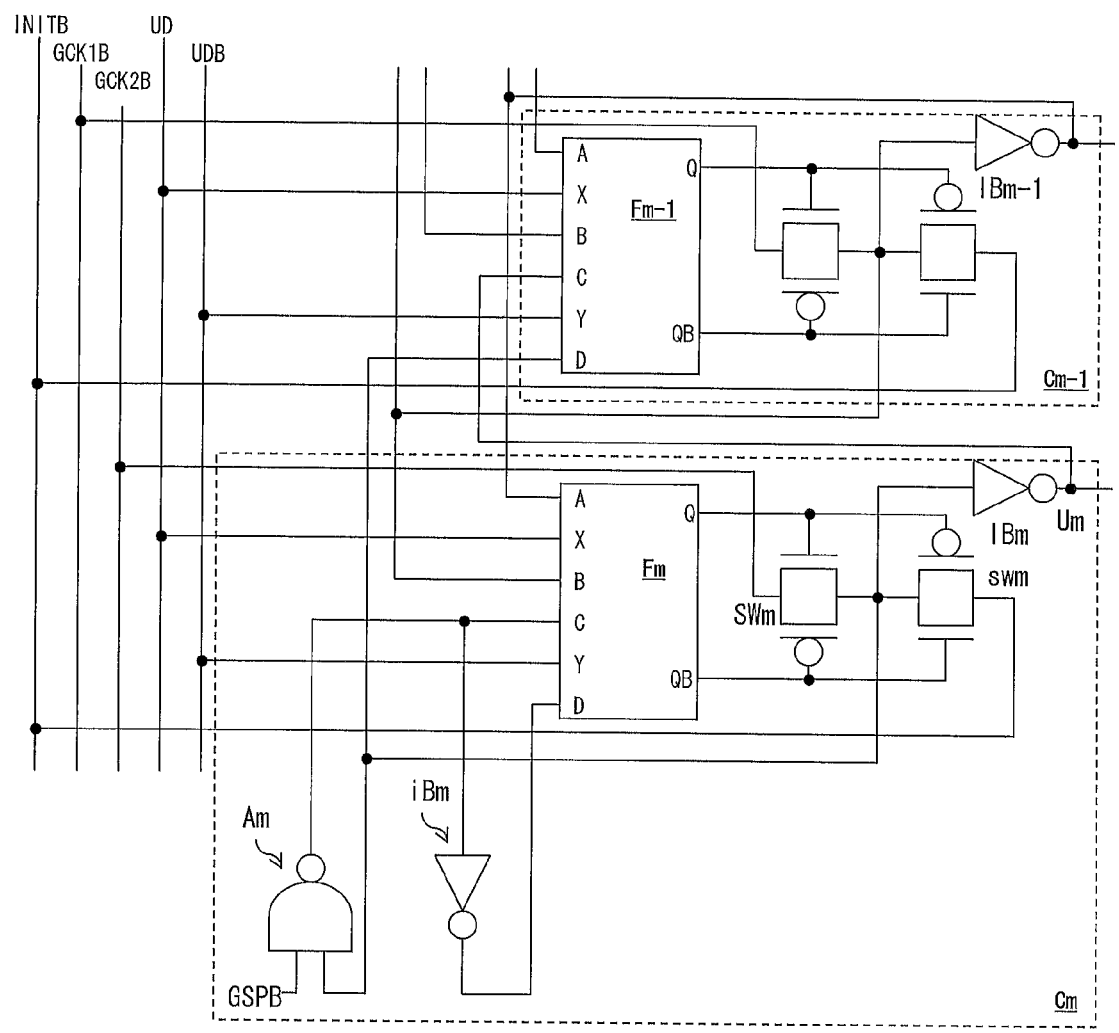
FIG. 9 is a circuit diagram illustrating another configuration (last stage) of the gate driver in accordance with Embodiment 1.

Alternatively, the unit circuit C1 of the first stage shown in FIG. 3 can be configured as shown in FIG. 8, and the unit circuit Cm of the last stage shown in FIG. 4 can be configured as shown in FIG. 9. Specifically, the unit circuit C1 can be configured such that: an inverter iB1 and a NAND A1 are added; one input terminal of the NAND circuit A1 is connected with an input terminal of the inverter IB1 of the current stage C1; the other input terminal of the NAND circuit A1 is connected with the GSPB (inverted gate start pulse) line; an output terminal of the NAND circuit A1 is connected with the A terminal of the flip-flop F1; and the A terminal and the B terminal of the flip-flop F1 are connected with each other via the inverter iB1. Further, the unit circuit Cm can be configure such that: an inverter iBm and a NAND Am are added; one input terminal of the NAND circuit Am is connected with an input terminal of the inverter IBm of the current stage Cm; the other input terminal of the NAND circuit Am is connected with the GSPB (inverted gate start pulse) line; an output terminal of the NAND circuit Am is connected with the C terminal of the flip-flop Fm; and the C terminal and the D terminal of the flip-flop Fm are connected with each other via the inverter iBm.

Figure 10:
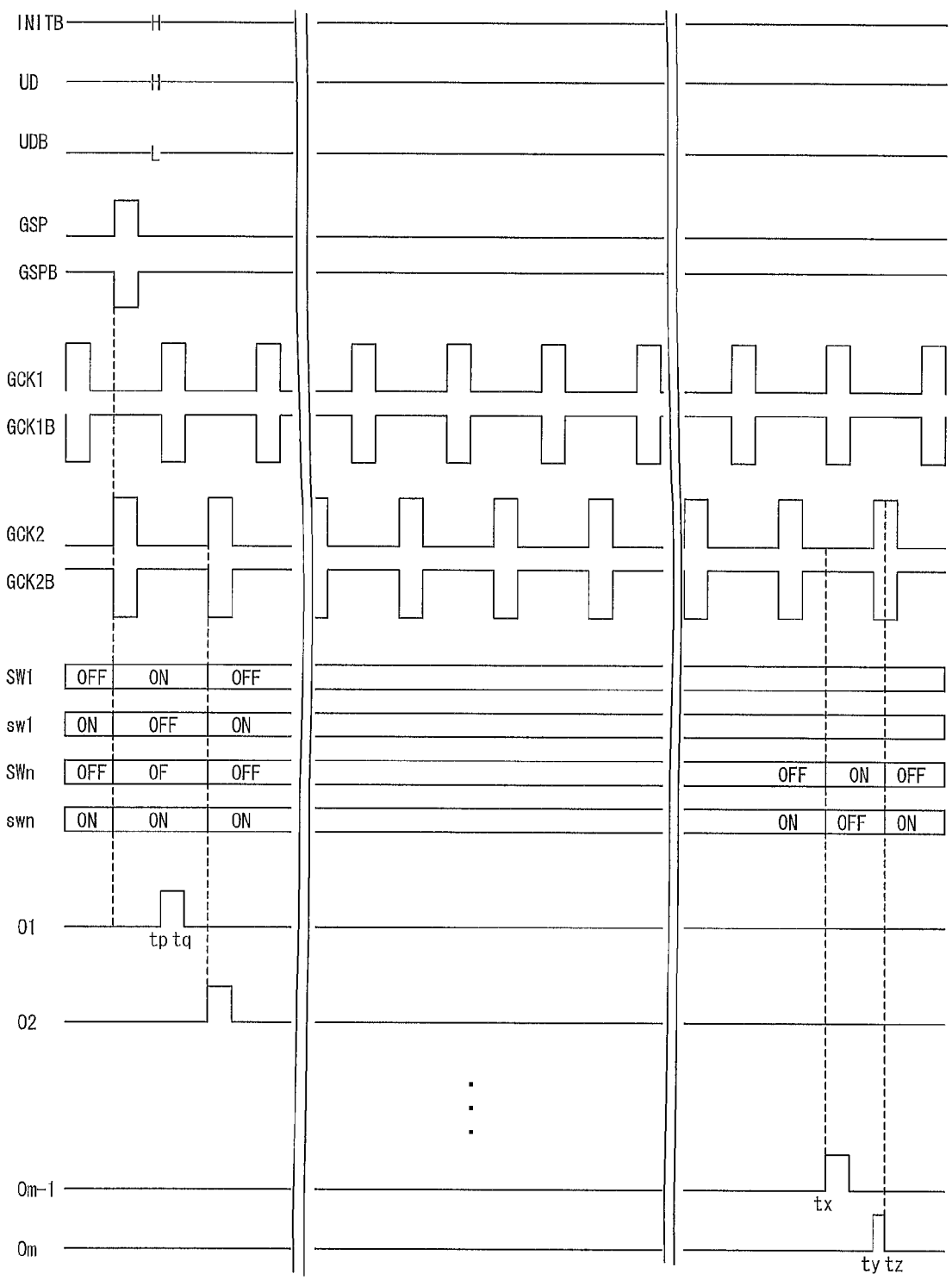
FIG. 10 is a timing chart showing operations of a gate driver including the flip-flop shown in FIGS. 8 and 9 (in the case of forward shifting).

According to the configurations of FIGS. 8 and 9, when the GSPB becomes active ("L") before the start of forward shifting, an output from the NAND A1 of the current stage C1 changes from "L" to "H" (see FIG. 10). That is, the A terminal of the flip-flop F1 is "H", the B terminal of the flip-flop F1 is "L", the C terminal of the flip-flop F1 is "L", the D terminal of the flip-flop F1 is "H", and the analog switch 11 of the flip-flop F1 is in the ON state and the analog switch 12 of the flip-flop F1 is in the OFF state. This causes the "H" of the UD to be supplied to the latch circuit LC via the X terminal, thereby the latch circuit is updated and the Q terminal becomes "H" and the QB terminal becomes "L" (that is, the analog switch SW1 is turned ON and the analog switch sw1 is turned OFF). From this point in time (even after the GSPB has returned to "H" and the analog switch 11 has been turned OFF), this state is maintained until the next time the latch circuit LC is updated. That is, the output signal O1 rises to "H" at tp and falls to "L" at tq.

Further, when an output signal Om−1 from a stage Cm−1 which precedes the last stage Cm becomes "H" at tx, the latch circuit of the flip-flop Fm is updated and the Q terminal becomes "H" and the QB terminal becomes "L" (that is, the analog switch SW m is turned ON and the analog switch swm is turned OFF). Therefore, from this point in time (even after the output signal Om−1 has become "L"), this state is maintained and an inverted version (GCK2) of the GCK2B is supplied to the driving terminal Um of the last stage Cm. Note here that, during a period during which the GCK2B is "H", the latch circuit is not updated because an output from the NAND Am is "L" (both of two inputs are "H"). When the GCK2B changes from "H" to "L" at ty, the output signal Om from the last stage Cm temporarily becomes "H". Then, when the output from the NAND Am becomes "H" because of the "L" of the GCK2B, the analog switch 11 of the flip-flop Fm is in the OFF state and the analog switch 12 of the flip-flop Fm is in the OFF state. This causes the "L" of the UDB to be supplied to the latch circuit LC via the Y terminal, thereby the latch circuit is updated and the Q terminal becomes "L" and the QB terminal becomes "H" (that is, the analog switch SWm is turned OFF and the analog switch swm is turned ON). Accordingly, the output signal Om of the last stage Cm is reset to "L" at tz after a predetermined time from ty. The same applies to reverse shifting.

According to the configurations of FIGS. 8 and 9, self-resetting occurs in the stage at which the shifting ends (this stage is the last stage in the case of forward shifting, and is the first stage in the case of reverse shifting) (see FIG. 10). Therefore, it is necessary to make the GSP (shift start signal) and the GSPB (inverted shift start signal) active only before the start of the shifting period.

Figure 11:
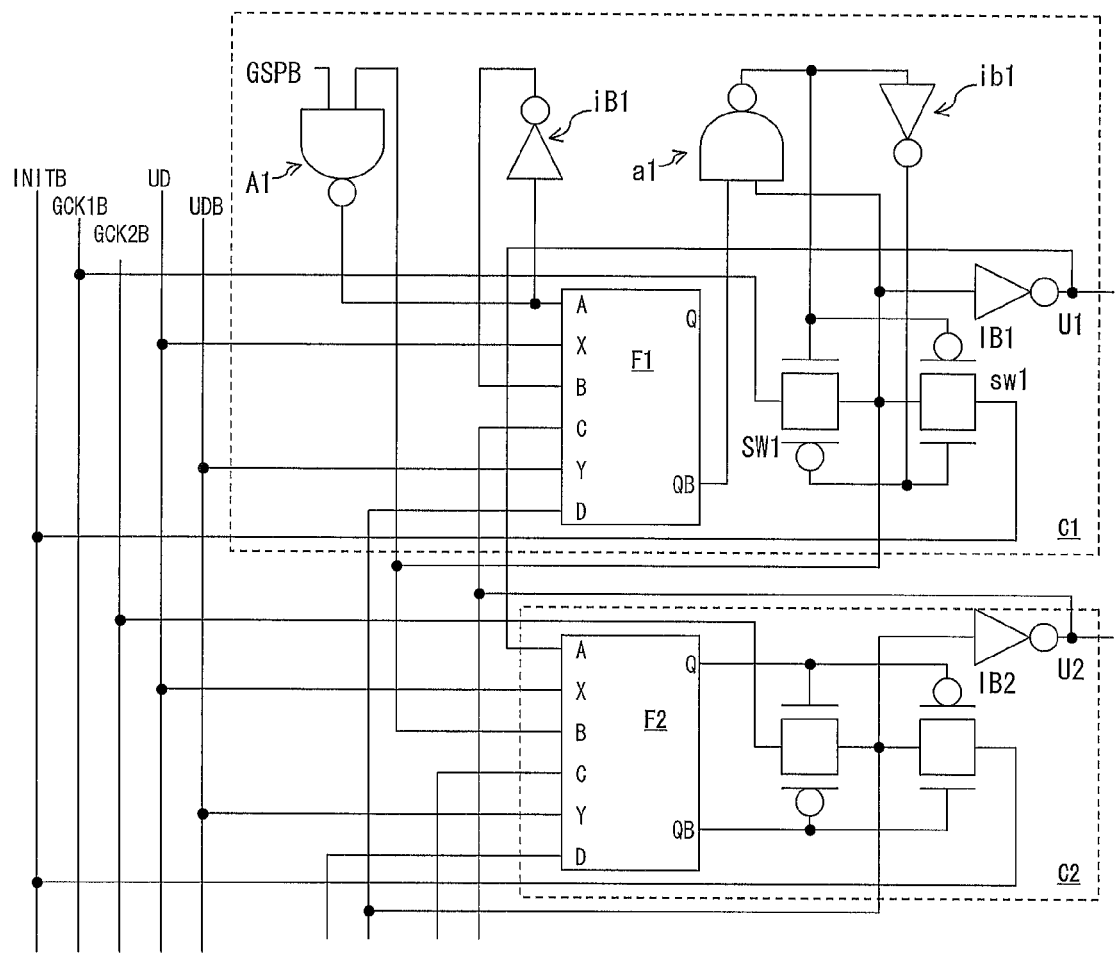
FIG. 11 is a circuit diagram illustrating a further configuration (first stage) of the gate driver in accordance with Embodiment 1.
Figure 12:
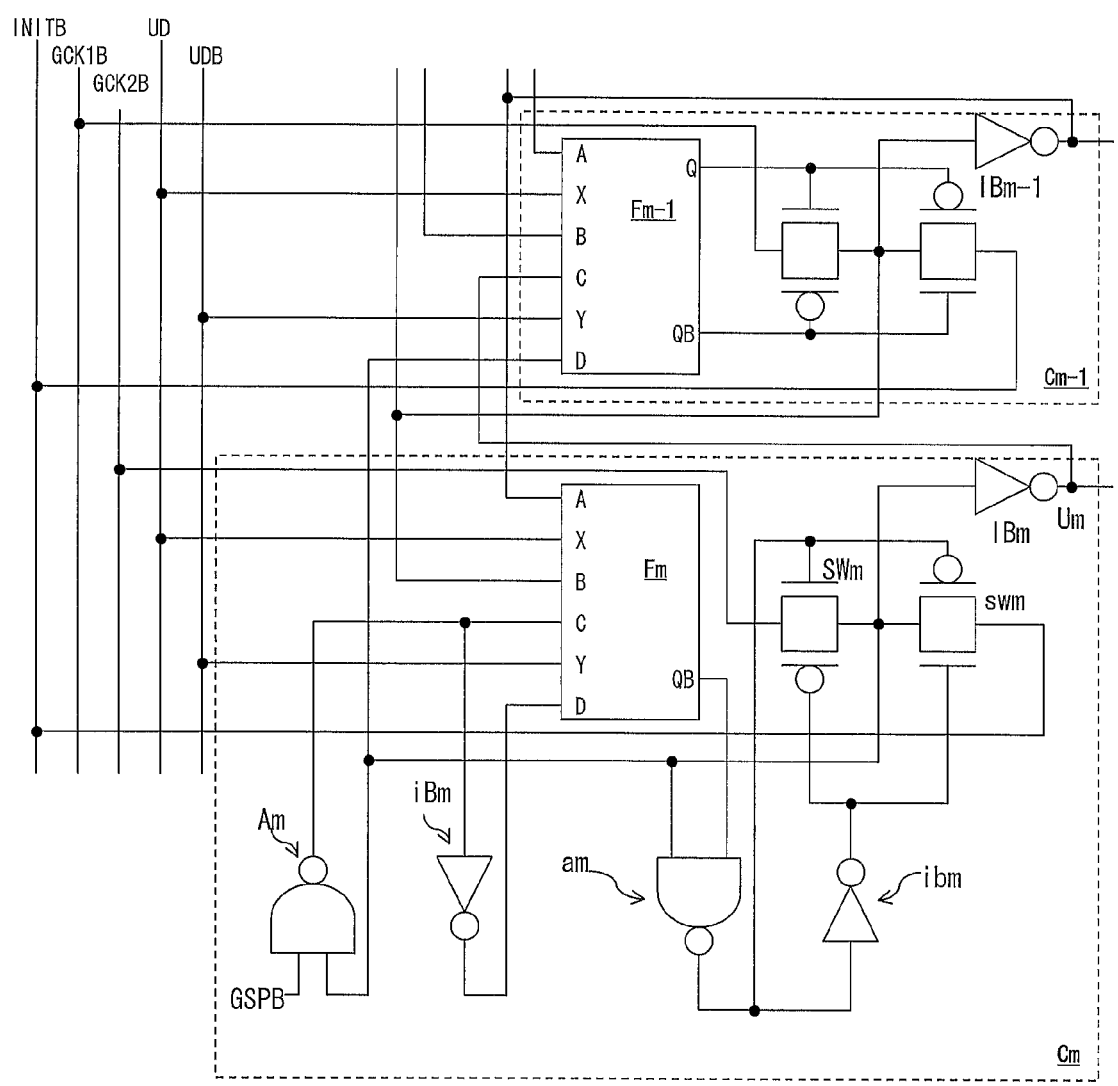
FIG. 12 is a circuit diagram illustrating a further configuration (last stage) of the gate driver in accordance with Embodiment 1.

Further, the unit circuit C1 of the first stage shown in FIG. 8 can be modified as shown in FIG. 11, and the unit circuit Cm of the last stage shown in FIG. 9 can be modified as shown in FIG. 12. That is, the configuration of FIG. 11 is different from the configuration of FIG. 8 in that (i) an inverter ib1 and a NAND a1 are added and (ii) connections of the Q and QB terminals of the flip-flop F1 are changed. Specifically, the configuration of FIG. 11 is such that: one input terminal of the NAND circuit a1 is connected with an input terminal of the inverter IB1 of the current stage C1; the other input terminal of the NAND circuit a1 is connected with the QB terminal of the flip-flop F1; an output terminal of the NAND circuit a1 is connected with an input terminal of the inverter iB1, with the P terminal of the analog switch SW1 and with the N terminal of the analog switch sw1; and an output terminal of the inverter ib1 is connected with the N terminal of the analog switch SW1 and with the P terminal of the analog switch sw1. The Q terminal of the flip-flop F1 is closed. Similarly, the configuration of FIG. 12 is different from the configuration of FIG. 9 in that (a) an inverter ibm and a NAND am are added and (B) connections of the Q and QB terminals of the flip-flop Fm are changed. Specifically, the configuration of FIG. 12 is such that: one input terminal of the NAND circuit am is connected with an input terminal of the inverter IBm of the current stage Cm; the other input terminal of the NAND circuit am is connected with the QB terminal of the flip-flop F1; an output terminal of the NAND circuit am is connected with an input terminal of the inverter iBm, with the P terminal of the analog switch SWm and with the N terminal of the analog switch swm; and an output terminal of the inverter ibm is connected with the N terminal of the analog switch SWm and with the P terminal of the analog switch swm. The Q terminal of the flip-flop Fm is closed.

Figure 13:
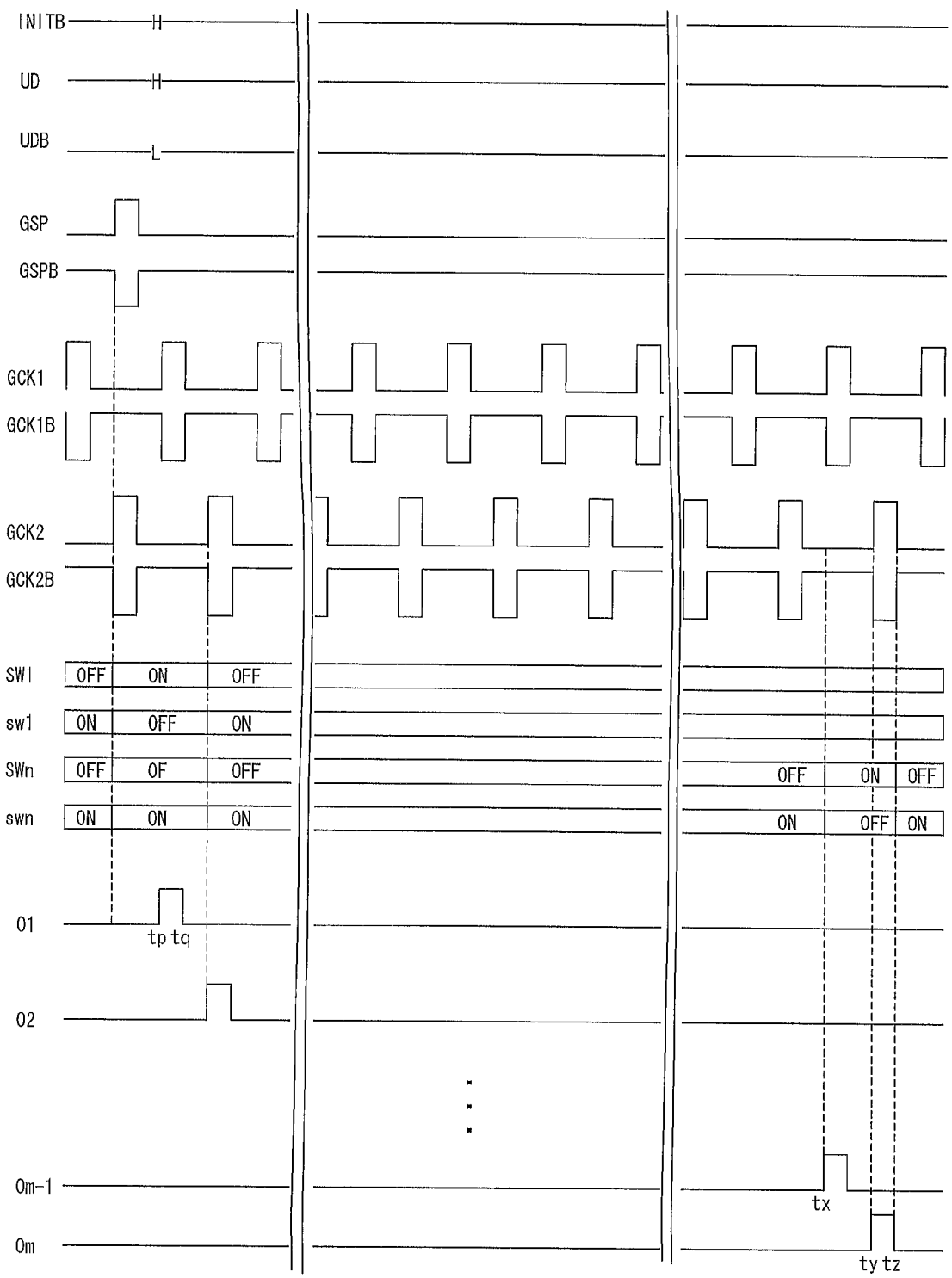
FIG. 13 is a timing chart showing operations of a gate driver including the flip-flop shown in FIGS. 11 and 12 (in the case of forward shifting).

According to the configurations of FIGS. 11 and 12, when the GSPB becomes active ("L") before the start of forward shifting, an output from the NAND A1 of the first stage C1 changes from "L" to "H" (see FIG. 13). That is, the A terminal of the flip-flop F1 is "H", the B terminal of the flip-flop F1 is "L", the C terminal of the flip-flop F1 is "L", the D terminal of the flip-flop F1 is "H", and the analog switch 11 of the flip-flop F1 is in the ON state and the analog switch 12 of the flip-flop 11 is in the OFF state. This updates the latch circuit, and the Q terminal becomes "H" and the QB terminal becomes "L" (output from the NAND a1 becomes "H", output from the inverter ib1 becomes "L", the analog switch SW1 is turned ON, and the analog switch sw1 is turned OFF). Accordingly, from this point in time (even after the GSPB has returned to "H" and the analog switch 11 has been turned OFF), this state is maintained until the next time the latch circuit LC is updated. That is, the output signal O1 rises to "H" at tp and falls back to "L" at tq.

Further, when an output signal Om−1 from a stage Cm−1 which precedes the last stage Cm becomes "H" at tx, the latch circuit of the flip-flop Fm is updated, and the Q terminal becomes "H" and the QB terminal becomes "L" (that is, output from the NAND am becomes "H", output from the inverter ibm becomes "L", the analog switch SWm is turned ON, and the analog switch swm is turned OFF). Therefore, from this point in time (even after the output signal Om−1 has become "L"), this state is maintained and an inverted version (GCK2) of the GCK2B is supplied to the driving terminal Um of the last stage Cm. Note here that, since an output from the NAND Am is "L" (both of two inputs are "H") during a period during which the GCK2B is "H", the latch circuit is not updated. When the GCK2B changes from "H" to "L" at ty, the output signal Om from the last stage Cm becomes "H", the output from the NAND Am becomes "H", and the analog switch 12 of the flip-flop F1 is turned ON. This updates the latch circuit, and the Q terminal becomes "L" and the QB terminal becomes "H" (output from the NAND am becomes "H", output from the inverter ibm becomes "L", the analog switch SW m is turned ON, and the analog switch swm is turned OFF). Then, when the GCK2B changes from "L" to "H" at tz, the output from the NAND am becomes "L", and thus the analog switch SWm is turned OFF and the analog switch swm is turned ON. Accordingly, the output signal Om of the last stage Cm is reset to "L". The same applies to reverse shifting.

According to the configurations of FIGS. 11 and 12, it is possible to carry out self-resetting in the stage at which the shifting ends (this stage is the last stage in the case of forward shifting, and is the first stage in the case of reverse shifting), and also to cause the pulse width of the output signal from the stage at which the shifting ends to be the same as those of the other stags (see FIG. 13).

Figure 14:
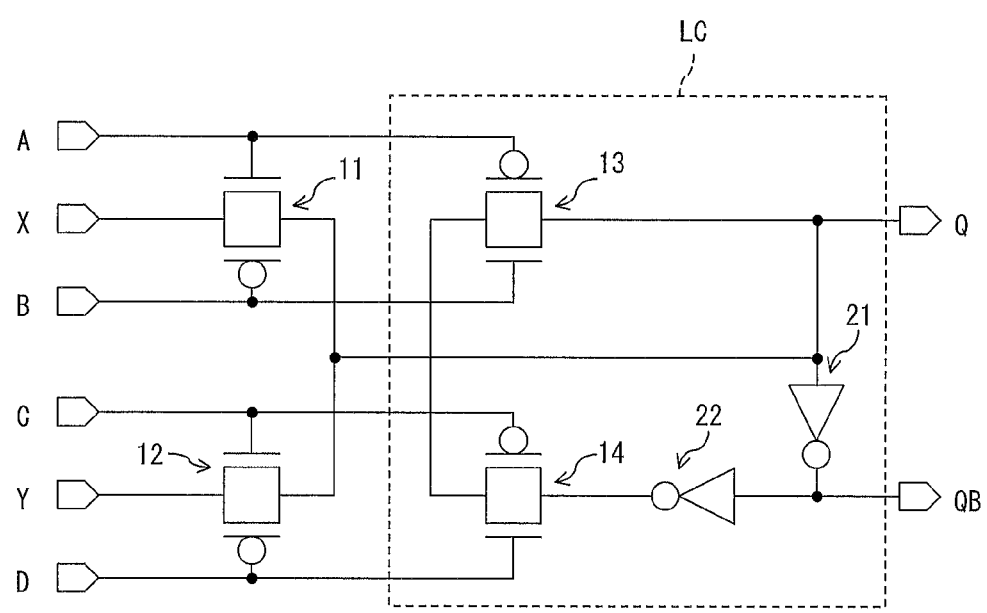
FIG. 14 is a modified example of the flip-flop shown in FIG. 5.

According to the present embodiment, the latch circuit LC of the flip-flop Fn shown in FIG. 5 can be modified as shown in FIG. 14. Specifically, the output terminal of the inverter 22 and the input terminal of the inverter 21 of the latch circuit LC shown in FIG. 5 are connected with each other not directly but via analog switches 13 and 14, a P terminal of the analog switch 13 is connected with the A terminal, an N terminal of the analog switch 13 is connected with the B terminal, a P terminal of the analog switch 14 is connected with the C terminal, and an N terminal of the analog switch 14 is connected with the D terminal. This achieves the following. That is, (i) when the analog switch 11 or 12 is in the ON state and the latch circuit LC is receiving the UD or the UDB, the analog switch 13 or 14 is in the OFF state so that no feedback occurs and (ii) when both the analog switches 11 and 12 are in the OFF state and the latch circuit LC is receiving neither the UD nor the UDB, the analog switches 13 and 14 are in the ON state so that feedback occurs.

Figure 15:
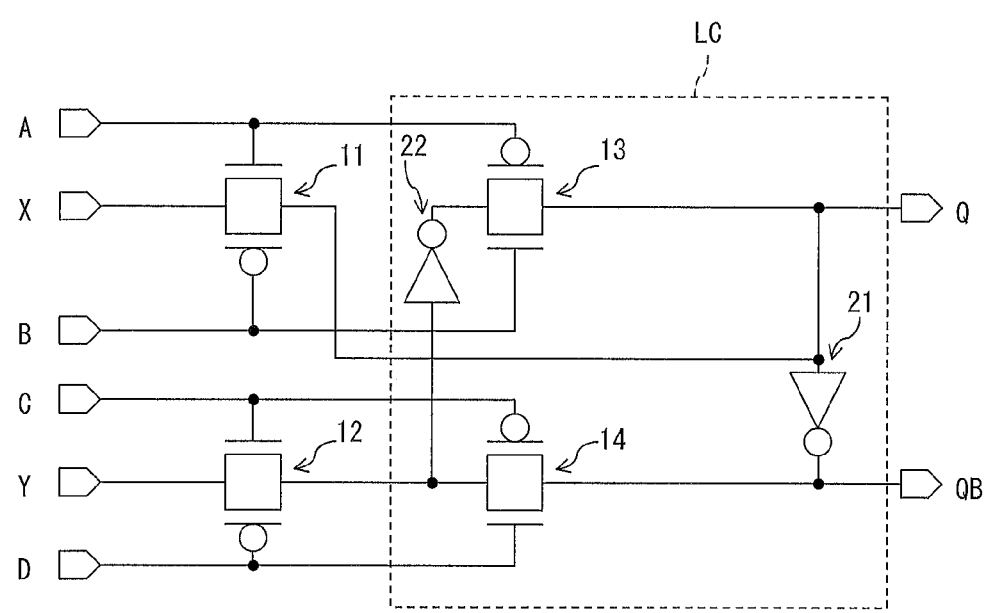
FIG. 15 is another modified example of the flip-flop shown in FIG. 5.

Further, the flip-flop Fn shown in FIG. 5 can be modified as shown in FIG. 15. Specifically, the output terminal of the inverter 21 and the input terminal of the inverter 22 of the latch circuit LC shown in FIG. 5 are connected with each other not directly but via the analog switch 13; the output terminal of the inverter 22 and the input terminal of the inverter 21 of the latch circuit LC shown in FIG. 5 are connected with each other not directly but via the analog switch 14; the Y terminal of the flip-flop Fn shown in FIG. 5 is connected with the input terminal of the inverter 22 (not with the input terminal of the inverter 21) via the analog switch 12; the P terminal of the analog switch 13 is connected with the A terminal; the N terminal of the analog switch 13 is connected with the B terminal; the P terminal of the analog switch 14 is connected with the C terminal; and the N terminal of the analog switch 14 is connected with the D terminal. This achieves the following. That is, (i) when the analog switch 11 or 12 is in the ON state and the latch circuit LC is receiving the UD or the UDB, the analog switch 13 or 14 is in the OFF state so that no feedback occurs, (ii) when both the analog switches 11 and 12 are in the OFF state and the latch circuit LC is receiving neither the UD nor the UDB, the analog switches 13 and 14 are in the ON state so that feedback occurs, and (iii) when both the analog switches 11 and 12 are in the ON state, both the analog switches 13 and 14 are in the OFF state so that the inverter 21 of the latch circuit LC receives the UD (from the X terminal), the inverter 22 of the latch circuit LC receives the UDB (from the Y terminal), and no feedback occurs. Note that, according to a gate driver including the flip-flop Fn shown in FIG. 15, the UD and the UDB are the same signals (both are "H" in the case of forward shifting, and both are "L" in the case of reverse shifting) during a shifting period.

According to the shift register in which each stage (each unit circuit) includes the flip-flop Fn shown in FIG. 15, even if both the analog switches 11 and 12 are turned ON, i.e., even if the output signal On−1 from the previous stage and the output signal On+1 from the subsequent stage are made active "H" at the same time, no problem occurs such as a short circuit between the X and Y terminals of the flip-flop Fn of the current stage. This is suitable for the case where it is necessary to cause the output signals from all the stages to be active "H" before the start of shifting so that all scanning signal lines are simultaneously selected (i.e., so-called all-ON of the scanning signal lines).

Figure 16:
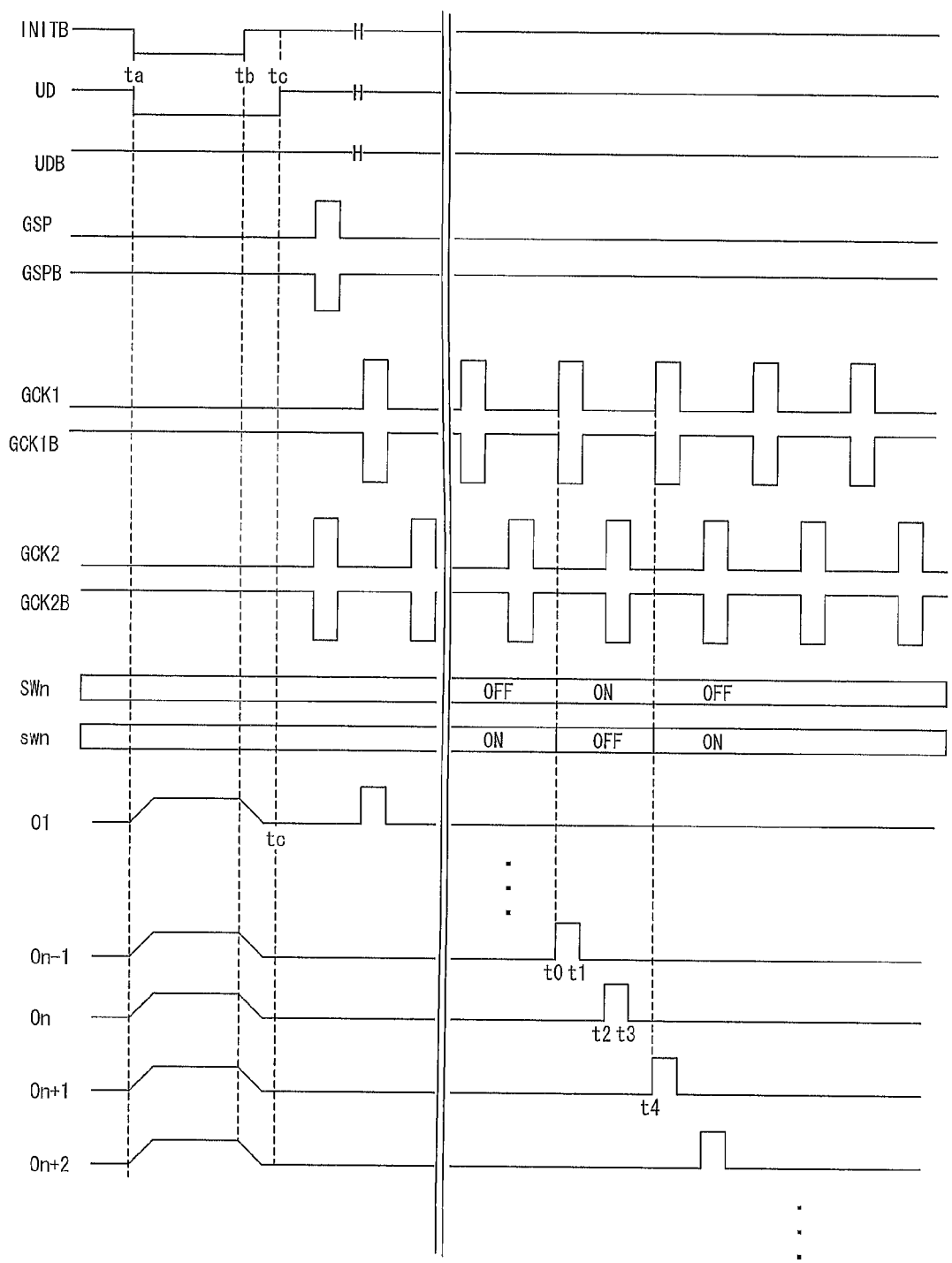
FIG. 16 is a timing chart showing operations of a gate driver including the flip-flop shown in FIG. 5 (in the case of all-ON and forward shifting).

FIG. 16 is a timing chart showing operations of the gate driver including the flip-flop Fn shown in FIG. 15 in the case of forward shifting (from the first stage to the last stage).

First, at to before the start of shifting, the INITB signal is made active "L" and the UN is changed to "L" (the UDB is maintained at "H"). After that, at tb, the INITB signal is made non-active "H" (the UD is maintained at "L" and the UDB is maintained at "H"). After that, at tc (before the start of shifting), the UD is changed to "H" (the UDB is maintained at "H") (these operations are carried out in the case of forward shifting). This makes it possible to make sure that all-ON operation is carried out, and possible to supply the UD "L" to the latch circuits LC of all the stages to thereby cause the Q terminals of the respective flip-flops to be "L" and initialize the shift register.

Further, when the output signal On−1 from the previous stage becomes "H" at t0, the output signal On+1 from the subsequent stage is "L". Therefore, the A terminal of the flip-flop Fn is "H", the B terminal of the flip-flop Fn is "L", the C terminal of the flip-flop Fn is "L", the D terminal of the flip-flop Fn is "H", and the analog switch 11 of the flip-flop Fn is in the ON state and the analog switch 12 of the flip-flop Fn is in the OFF state. This causes the "H" of the UD to be supplied to the inverter 21 (refer to FIG. 15), thereby the latch circuit is updated and the Q terminal becomes "H" and the QB terminal becomes "L" (that is, the analog switch SWn is turned ON and the analog switch swn is turned OFF). This state is maintained from t0 (even after the output signal On−1 has fallen and the analog switch 11 has been turned OFF) until the next time the latch circuit LC is updated. That is, an inverted version (GCK2) of the GCK2B is supplied to the driving terminal Un of the current stage, and thus the output signal On from the current stage rises to "H" at t2 and falls to "L" at t3.

Further, when the output signal On+1 from the subsequent stage becomes "H" at t4, the output signal On−1 from the previous stage is "L". Therefore, the A terminal of the flip-flop Fn is "L", the B terminal of the flip-flop Fn is "H", the C terminal of the flip-flop Fn is "H", the D terminal of the flip-flop Fn is "L", and the analog switch 11 of the flip-flop Fn is in the OFF state and the analog switch 12 of the flip-flop Fn is in the ON state. This causes the "H" of the UDB to be supplied to the inverter 22 via the Y terminal (refer to FIG. 15), thereby the latch circuit is updated and the Q terminal becomes "L" and the QB terminal becomes "H" (that is, the analog switch SWn is turned OFF and the analog switch swn is turned ON). This state is maintained from t4 (even after the output signal On+1 has fallen and the analog switch 12 has been turned OFF) until the next time the latch circuit LC is updated. That is, an inverted version of the INITB "H" is supplied to the driving terminal Un of the current stage, and thus the output signal On from the current stage is "L" at and after t4.

Embodiment 2

Figure 17:
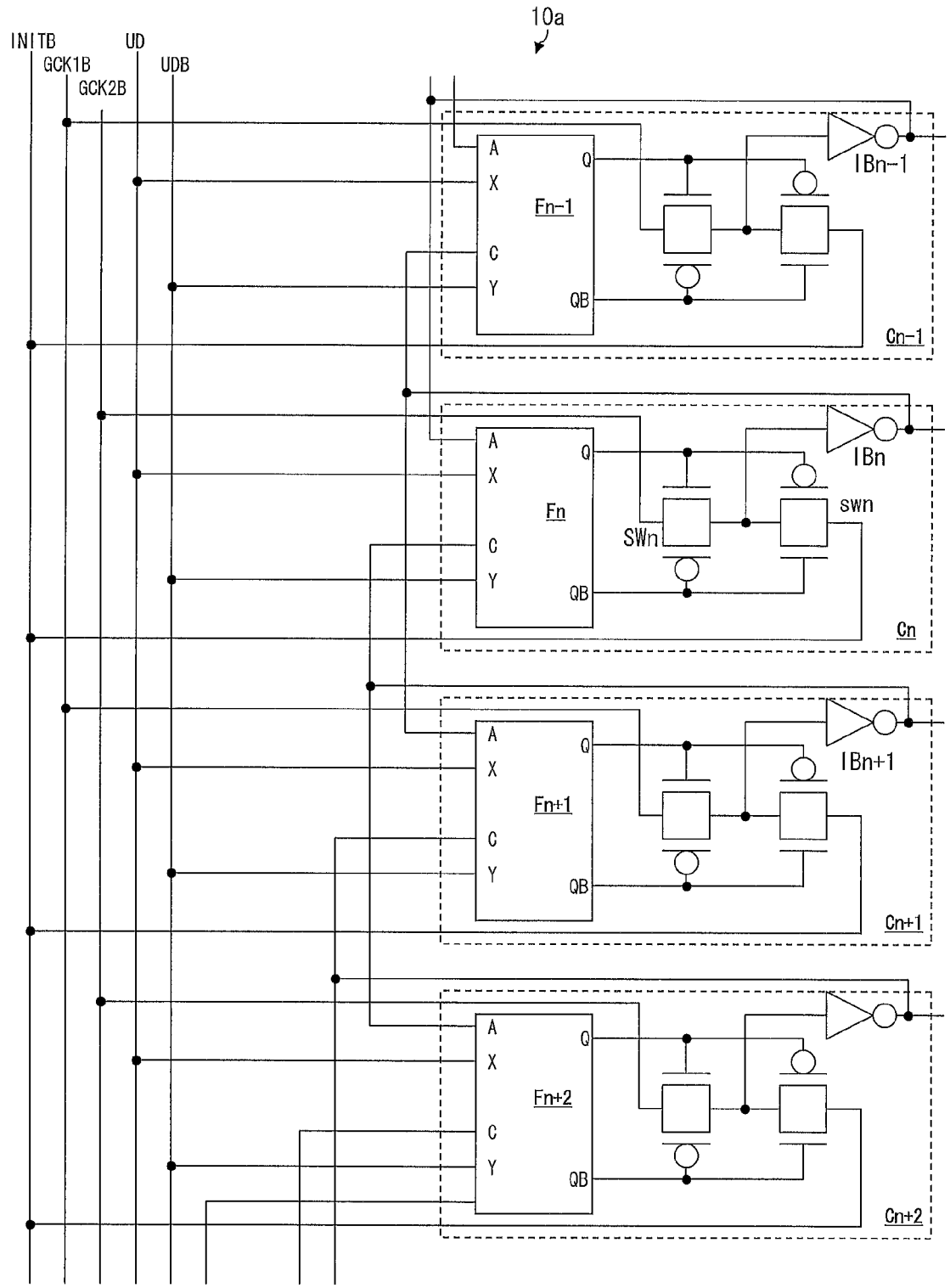
FIG. 17 is a circuit diagram illustrating a configuration of a gate driver in accordance with Embodiment 2.

FIG. 17 is a circuit diagram illustrating another configuration of the gate driver 12 (a gate driver of the present embodiment) shown in FIG. 1. As illustrated in FIG. 17, the gate driver of the present embodiment includes an INITB (inversion initialization signal) line, a GCK1B (first inverted gate clock) line, a GCK2B (second inverted gate clock) line, a UD (shift direction signal) line, a UDB (inverted shift direction signal) line, and a shift register 10a (a shift register of the present embodiment) constituted by the first stage (first stage, unit circuit C1) to the mth stage (last stage, unit circuit Cm).

Note that the GCK1B (first inverted gate clock) and the GCK2B (second inverted gate clock) are two clock signals whose active periods (Low periods) do not overlap. Further, the INITB (inversion initialization signal) is a signal that becomes "Low (active)" at a time of initialization and is "High" in the other periods. Further, the UD (shift direction signal) is a signal that is "High" in the case of forward shifting and is "Low" in the case of reverse shifting. The UDB (inverted shift direction signal) is a signal that is "High" in the case of reverse shifting and is "Low" in the case of forward shifting.

A unit circuit Cn of the nth stage (n is an integer from 1 to m) includes a flip-flop Fn, two analog switches SWn and swn, an inverter IBn, and a driving terminal Un (a node connected with a scanning signal line Gn of the liquid crystal panel).

The flip-flop Fn has A and C terminals and X and Y terminals which serve as input terminals, and has a Q terminal (output terminal) and a QB terminal (inverting output terminal) which serve as output terminals.

The unit circuit Cn, in a case where the n is an integer of 2 to m−1, is configured such that: the Q terminal of the flip-flop Fn, an N terminal of the analog switch SWn and a P terminal of the analog switch swn are connected with one another; the QB terminal of the flip-flop Fn, a P terminal of the analog switch SWn, and an N terminal of the analog switch swn are connected with one another; one conducting terminal of the analog switch SWn, one conducting terminal of the analog switch swn, and an input terminal of the inverter IBn are connected with one another; an output terminal of the inverter IBn is connected with the driving terminal Un; the other conducting terminal of the analog switch swn is connected with the INITB line; and the other conducting terminal of the analog switch SWn is connected with the GCK2B line (in a case where n is an even number). Further, the A terminal of the flip-flop Fn is connected with a driving terminal Un−1 of a previous stage Cn−1, the C terminal of the flip-flop Fn is connected with a driving terminal Un+1 of a subsequent stage Cn+1, the X terminal of the flip-flop Fn is connected with the UD line, and the Y terminal of the flip-flop Fn is connected with the UDB line.

Figure 18:
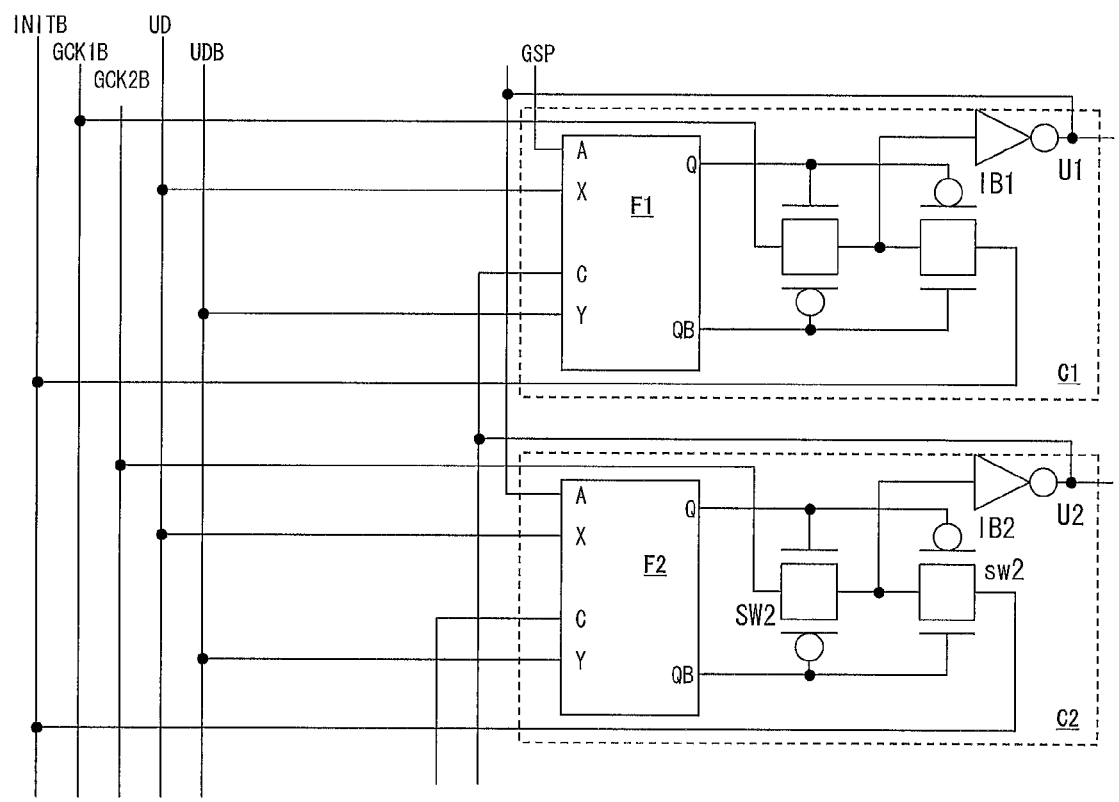
FIG. 18 is a circuit diagram illustrating a configuration (first stage) of the gate driver in accordance with Embodiment 2.
Figure 19:
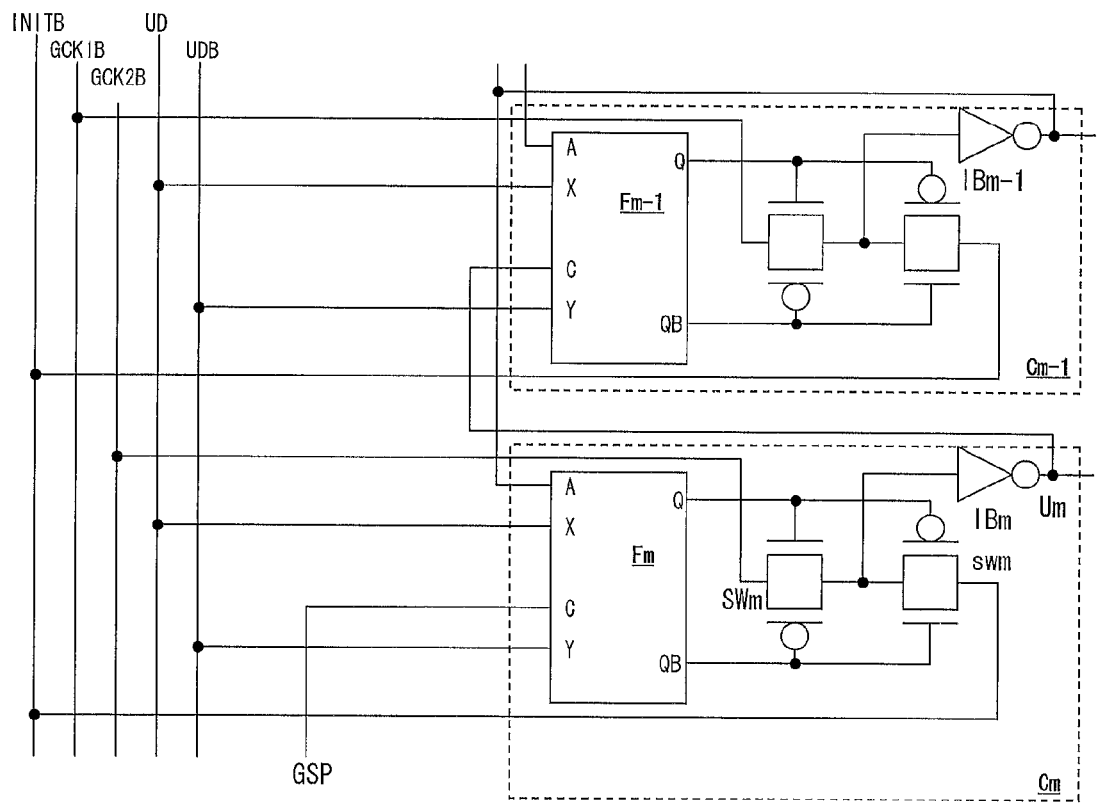
FIG. 19 is a circuit diagram illustrating a configuration (last stage) of the gate driver in accordance with Embodiment 2.

Further, as shown in FIG. 18, a unit circuit C1 (n=1) of the first stage is configured such that the A terminal of the flip-flop F1 is connected with a GSP (gate start pulse) line. The other connections are the same as those in the unit circuits C2 to Cm−1. A unit circuit Cm (n=m) of the last stage is configured such that, as shown in FIG. 19, the C terminal of the flip-flop Fm is connected with the GSP (gate start pulse) line. The other connections are the same as those in the unit circuits C2 to Cm−1.

Figure 20:
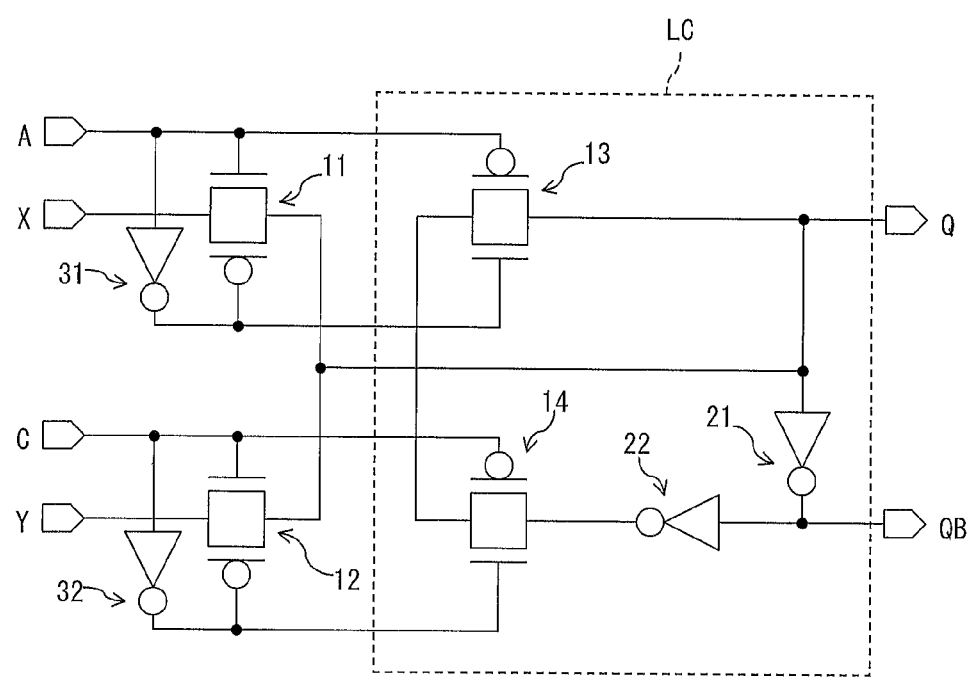
FIG. 20 is a circuit diagram illustrating a configuration of a flip-flop included in the gate driver shown in FIG. 17.

FIG. 20 shows a specific circuit configuration of the flip-flop Fn (n is an integer of 1 to m). As illustrated in FIG. 20, the flip-flop Fn includes analog switches 11 to 14 and inverters 21, 22, 31 and 32. The flip-flop Fn is configured such that: the A terminal is connected with an N terminal of the analog switch 11 and with a P terminal of the analog switch 13; the A terminal is further connected with a P terminal of the analog switch 11 and with an N terminal of the analog switch 13 via the inverter 31; the C terminal is connected with an N terminal of the analog switch 12 and with a P terminal of the analog switch 14; the C terminal is further connected with a P terminal of the analog switch 12 and with an N terminal of the analog switch 14 via the inverter 32; the X terminal is connected with an input terminal of the inverter 21 via the analog switch 11; and the Y terminal is connected with the input terminal of the inverter 21 via the analog switch 12. An output terminal of the inverter 21 is connected with an input terminal of the inverter 22, and an output terminal of the inverter 22 is connected with the input terminal of the inverter 21 via the analog switches 13 and 14. That is, a latch circuit LC is configured such that an output from the inverter 21 is fed back to the input terminal of the inverter 21 via the inverter 22 when the analog switches 13 and 14 are in the ON state.

In this way, the unit circuit Cn of the shift register 10a is configured to generate an output signal On of its stage (current stage) by (i) obtaining the INITB (inversion initialization signal) when an output (signals from Q and QB terminal terminals) from the flip-flop Fn is non-active whereas (ii) obtaining the GCK1B (in a case of an odd-numbered stage) or the GCK2B (in a case of an even-numbered stage) when the output from the flip-flop Fn is active, and to supply the output signal On to the scanning signal line Gn of the liquid crystal panel via the driving terminal Un. The UD (shift direction signal) is supplied to the latch circuit LC via the analog switch 11, and the UDB (inverted shift direction signal) is supplied to the latch circuit LC via the analog switch 12. In each of the flip-flops (i.e., flip-flops F2 to Fm−1) other than those of the first and last stages, an output signal On−1 from a previous stage Cn−1 is supplied to the N terminal of the analog switch 11, and an output signal On+1 from a subsequent stage Cn+1 is supplied to the N terminal of the analog switch 12.

The gate driver shown in FIG. 17 operates as shown in FIG. 6 in the case of forward shifting (from the first stage to the last stage).

When the output signal On−1 from the previous stage becomes "H" at t0, the output signal On+1 from the subsequent stage is "L". Therefore, the A terminal of the flip-flop Fn is "H", the C terminal of the flip-flop Fn is "L", and the analog switch 11 of the flip-flop Fn is in the ON state and the analog switch 12 of the flip-flop Fn is in the OFF state. This causes the "H" of the UD to be supplied to the latch circuit LC via the X terminal, thereby the latch circuit is updated and the Q terminal becomes "H" and the QB terminal becomes "L" (that is, the analog switch SWn is turned ON and the analog switch swn is turned OFF). This state is maintained from t0 (even after the output signal On−1 has fallen and the analog switch 11 has been turned OFF) until the next time the latch circuit LC is updated. That is, an inverted version (GCK2) of the GCK2B is supplied to the driving terminal Un of the current stage, and thus the output signal On of the current stage rises to "H" at t2 and falls to "L" at t3.

When the output signal On+1 from the subsequent stage becomes "H" at t4, the output signal On−1 from the previous stage is "L". Therefore, the A terminal of the flip-flop Fn is "L", the C terminal of the flip-flop Fn is "H", and the analog switch 11 of the flip-flop Fn is in the OFF state and the analog switch 12 of the flip-flop Fn is in the ON state. This causes the "L" of the UDB to be supplied to the latch circuit LC via the Y terminal, thereby the latch circuit is updated and the Q terminal becomes "L" and the QB terminal becomes "H" (that is, the analog switch SWn is turned OFF and the analog switch swn is turned ON). This state is maintained from t4 (even after the output signal On+1 has fallen and the analog switch 12 has been turned OFF) until the next time the latch circuit LC is updated.

That is, an inverted version of the INITB "H" is supplied to the driving terminal Un of the current stage, and thus the output signal On of the current stage is "L" at and after t4.

The GSP and GSPB become active before the start of a shifting period. This updates the latch circuit LC of the first stage C1 (from which the shifting starts), and the Q terminal of the F1 becomes "H" and the QB terminal of the F1 becomes "L" (that is, the analog switch SW1 is turned ON and the analog switch sw1 is turned OFF). Further, the GSP and GSPB become active also after the end of the shifting period. This updates the latch circuit LC of the last stage Cm (at which the shifting ends), and the Q terminal of the Fm becomes "L" and the QB terminal of the Fm becomes "H" (that is, the analog switch SWm is turned OFF and the analog switch swm is turned ON).

The gate driver shown in FIG. 17 operates as shown in FIG. 7 in the case of reverse shifting (from the last stage to the first stage).

When the output signal On+1 from the subsequent stage becomes "H" at t0, the output signal On−1 from the previous stage is "L". Therefore, the A terminal of the flip-flop Fn is "L", the C terminal of the flip-flop Fn is "H", and the analog switch 11 of the flip-flop Fn is in the OFF state and the analog switch 12 of the flip-flop Fn is in the ON state. This causes the "H" of the UDB to be supplied to the latch circuit LC via the Y terminal, thereby the latch circuit is updated and the Q terminal becomes "H" and the QB terminal becomes "L" (that is, the analog switch SWn is turned ON and the analog switch swn is turned OFF). This state is maintained from t0 (even after the output signal On+1 has fallen and the analog switch 12 has been turned OFF) until the next time the latch circuit LC is updated. That is, an inverted version (GCK2) of the GCK2B is supplied to the driving terminal Un of the current stage, and thus the output signal On of the current stage rises to "H" at t2 and falls to "L" at t3.

When the output signal On−1 from the previous stage becomes "H" at t4, the output signal On+1 from the subsequent stage is "L". Therefore, the A terminal of the flip-flop Fn is "H", the C terminal of the flip-flop Fn is "L", and the analog switch 11 of the flip-flop Fn is in the ON state and the analog switch 12 of the flip-flop Fn is in the OFF state. This causes the "L" of the UD to be supplied to the latch circuit LC via the X terminal, thereby the latch circuit is updated and the Q terminal becomes "L" and the QB terminal becomes "H" (that is, the analog switch SWn is turned OFF and the analog switch swn is turned ON). This state is maintained from t4 (even after the output signal On−1 has fallen and the analog switch 11 has been turned OFF) until the next time the latch circuit LC is updated. That is, an inverted version of the INITB "H" is supplied to the driving terminal Un of the current stage, and thus the output signal On of the current stage is "L" at and after t4. The GSP and GSPB become active before the start of a shifting period, thereby the latch circuit LC of the last stage Cm (from which the shifting starts) is updated and the Q terminal of the Fm becomes "H" and the QB terminal of the Fm becomes "L" (that is, the analog switch SW m is turned ON and the analog switch swm is turned OFF). Further, the GSP and GSPB become active also after the end of the shifting period, thereby the latch circuit LC of the first stage C1 (at which the shifting ends) is updated and the Q terminal of the F1 becomes "L" and the QB terminal of the F1 becomes "H" (that is, the analog switch SW1 is turned OFF and the analog switch sw1 is turned ON).

According to the gate driver shown in FIG. 17, it is possible to reduce the number of wires connecting between the signal lines (INITB line, GCK1B line, GCK2B line, UD line and UDB line) and the shift register, as compared to the gate driver shown in FIG. 2. Further, the flip-flop of each of the stages is configured such that (i) when the analog switch 11 or 12 is in the ON state and the latch circuit LC is receiving the UD or the UDB, the analog switch 13 or 14 is in the OFF state so that no feedback occurs and (ii) when both the analog switches 11 and 12 are in the OFF state and the latch circuit LC is receiving neither the UD nor the UDB, the analog switches 13 and 14 are in the ON state so that feedback occurs.

Figure 21:
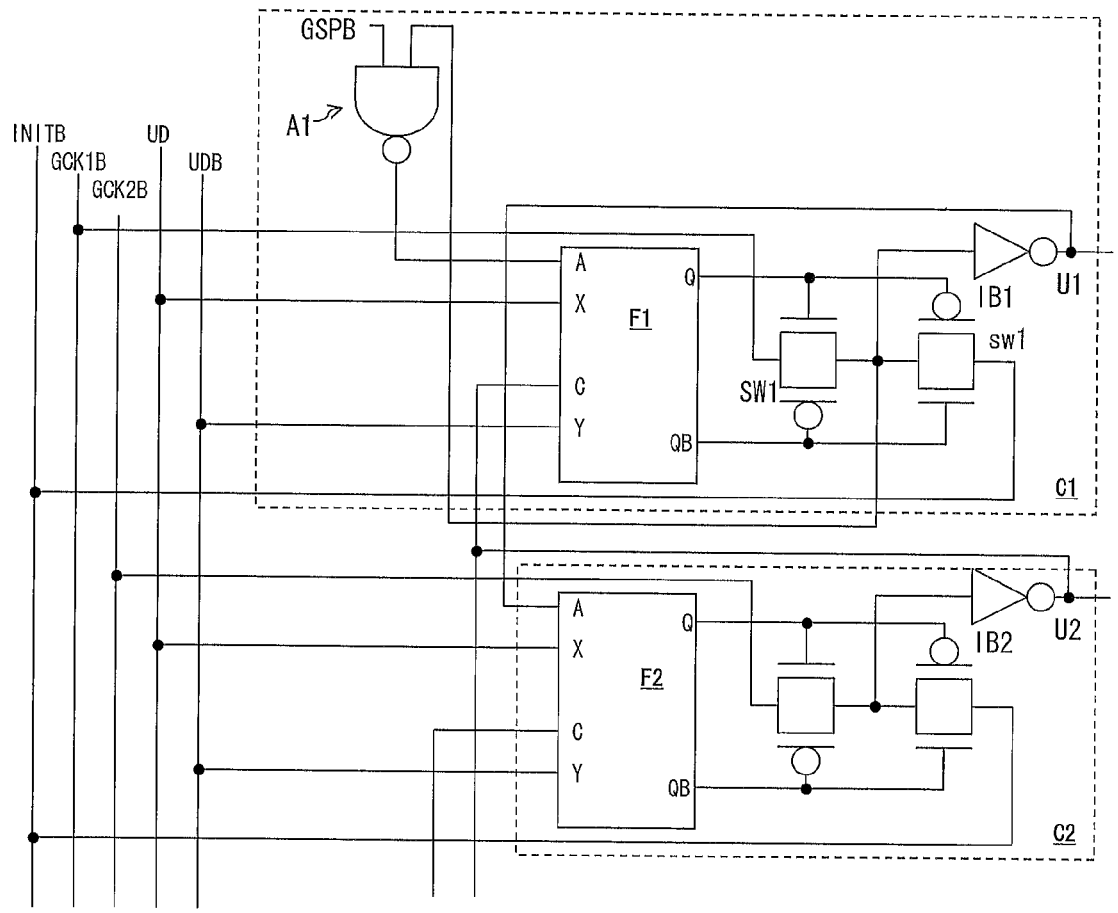
FIG. 21 is a circuit diagram illustrating another configuration (first stage) of the gate driver in accordance with Embodiment 2.
Figure 22:
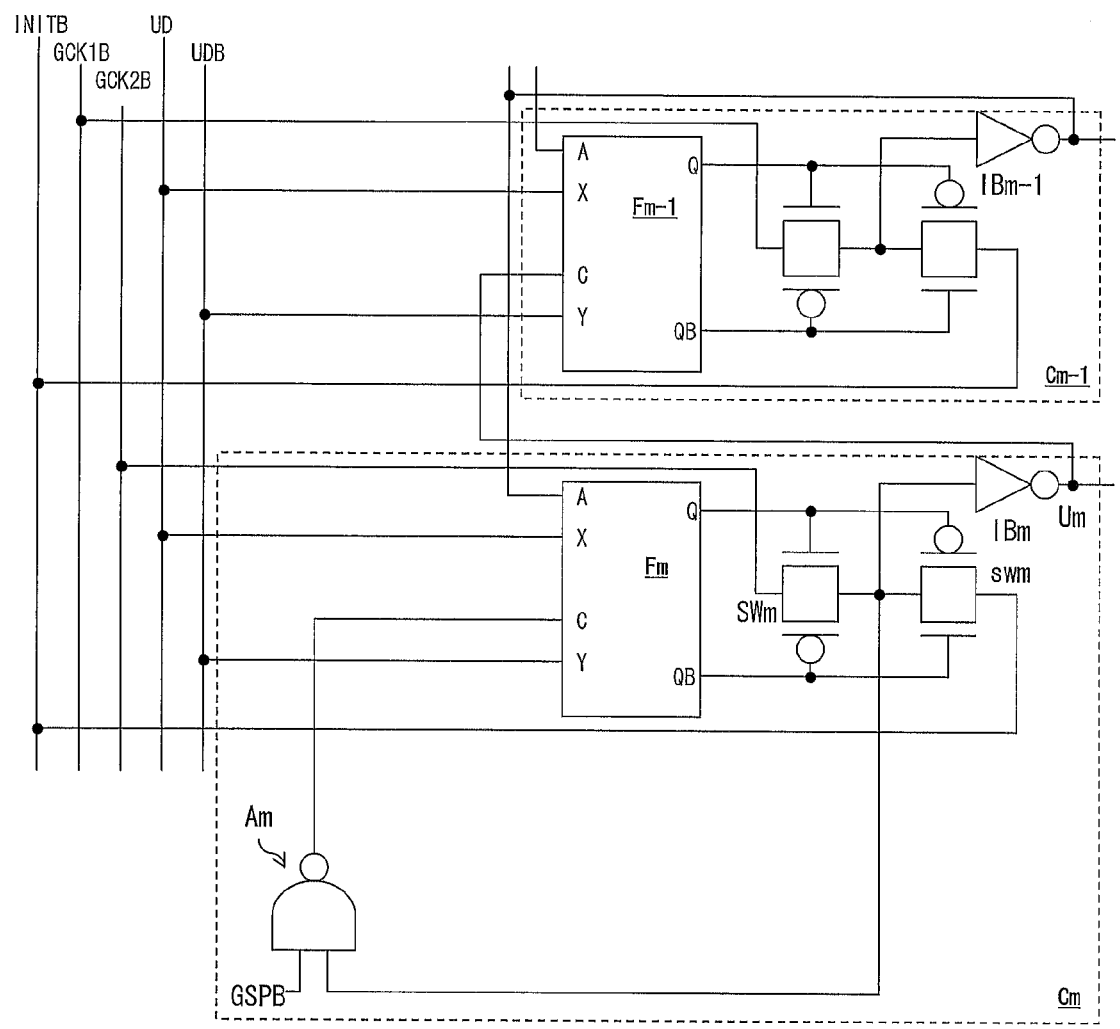
FIG. 22 is a circuit diagram illustrating another configuration (last stage) of the gate driver in accordance with Embodiment 2.

The unit circuit C1 of the first stage shown in FIG. 18 can be configured as shown in FIG. 21, and the unit circuit Cm of the last stage shown in FIG. 19 can be configured as shown in FIG. 22. Specifically, the unit circuit C1 can be configured such that: an inverter iB1 and a NAND A1 are added; one input terminal of the NAND circuit A1 is connected with an input terminal of the inverter IB1 of the current stage C1; the other input terminal of the NAND circuit A1 is connected with the GSPB (inverted gate start pulse) line; and an output terminal of the NAND circuit A1 is connected with the A terminal of the flip-flop F1. Further, the unit circuit Cm can be configured such that: an inverter iBm and a NAND Am are added; one input terminal of the NAND circuit Am is connected with an input terminal of the inverter IBm of the current stage Cm; the other input terminal of the NAND circuit Am is connected with the GSPB (inverted gate start pulse) line; and an output terminal of the NAND circuit Am is connected with the C terminal of the flip-flop Fm.

According to the configurations of FIGS. 21 and 22, when the GSPB becomes active ("L") before the start of forward shifting (see FIG. 10), an output from the NAND A1 of the first stage C1 changes from "L" to "H". That is, the A terminal of the flip-flop F1 is "H", the C terminal of the flip-flop F1 is "L", and the analog switch 11 of the flip-flop F1 is in the ON state and the analog switch 12 of the flip-flop F1 is in the OFF state. This causes the "H" of the UD to be supplied to the latch circuit LC via the X terminal, thereby the latch circuit is updated and the Q terminal becomes "H" and the QB terminal become "L" (that is, the analog switch SW1 is turned ON and the analog switch sw1 is turned OFF). From this point in time (even after the GSPB has returned to "H" and the analog switch 11 has been turned OFF), this state is maintained until the next time the latch circuit LC is updated. That is, the output signal O1 rises to "H" at tp and falls to "L" at tq.

Further, when an output signal Om−1 from a stage Cm−1 which precedes the last stage Cm becomes "H" at tx, the latch circuit of the flip-flop Fm is updated, and the Q terminal becomes "H" and the QB terminal becomes "L" (that is, the analog switch SWm is turned ON and the analog switch swm is turned OFF). Therefore, from this point in time (even after the output signal Om−1 has become "L"), this state is maintained and an inverted version (GCK2) of the GCK2B is supplied to the driving terminal Um of the last stage Cm. Note here that, during a period during which the GCK2B is "H", the latch circuit is not updated because an output from the NAND Am is "L" (both of two inputs are "H"). When the GCK2B changes from "H" to "L" at ty, the output signal Om from the last stage Cm temporality becomes "H. Then, when the output from the NAND Am becomes "H" because of "L" of the GCK2B, the analog switch 11 of the flip-flop Fm is in the OFF state and the analog switch 12 of the flip-flop Fm is in the OFF state. This causes the "L" of the UDB to be supplied to the latch circuit LC via the Y terminal, thereby the latch circuit is updated and the Q terminal becomes "L" and the QB terminal becomes "H" (that is, the analog switch SWm is turned OFF and the analog switch swm is turned ON). Accordingly, the output signal Om of the last stage Cm is reset to "L" at tz after a predetermined time from ty. The same applies to reverse shifting.

According to the configurations of FIGS. 21 and 22, self-resetting occurs in the stage at which the shifting ends (this stage is the last stage in the case of forward shifting, and is the first stage in the case of reverse shifting) (see FIG. 10). Therefore, it is necessary to make the GSP (shift start signal) and the GSPB (inverted shift start signal) active only before the start of a shifting period.

Figure 23:
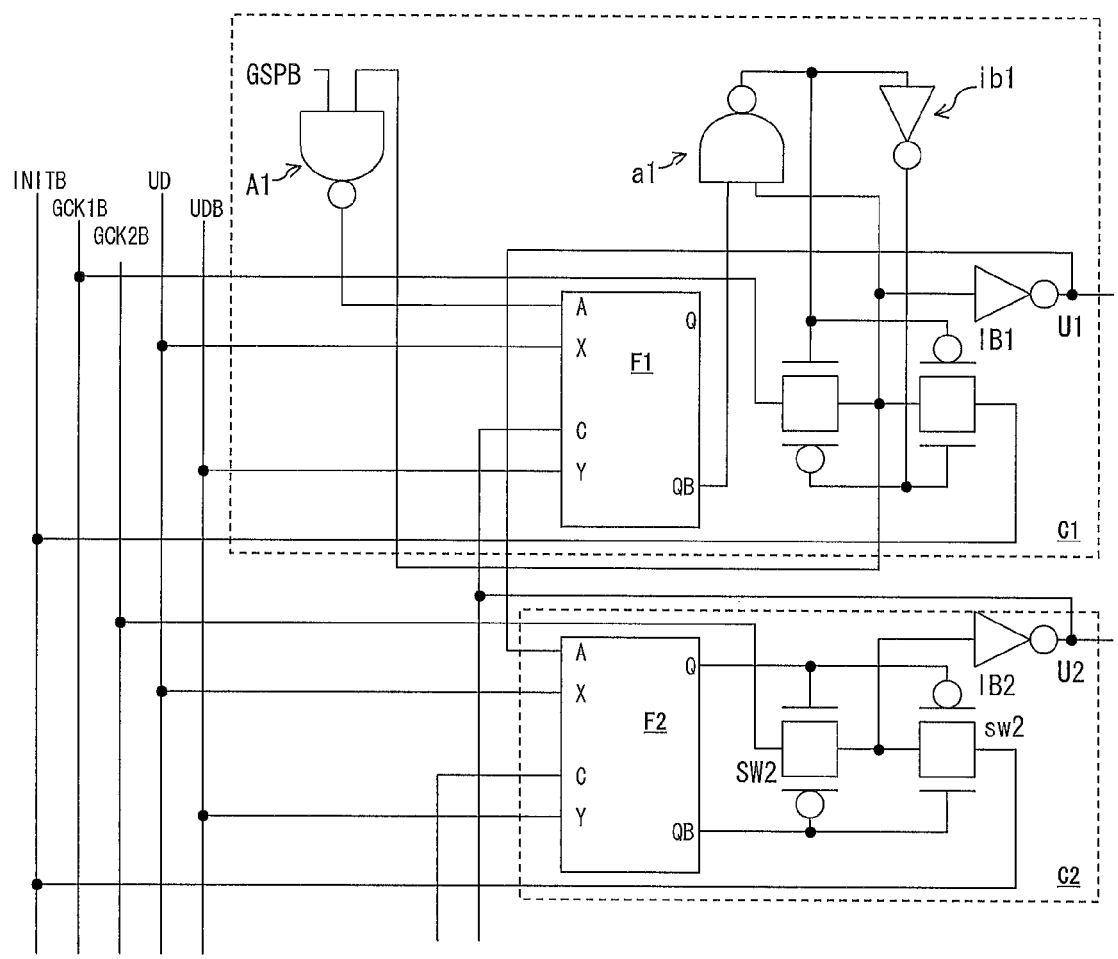
FIG. 23 is a circuit diagram illustrating a further configuration (first stage) of the gate driver in accordance with Embodiment 2.
Figure 24:
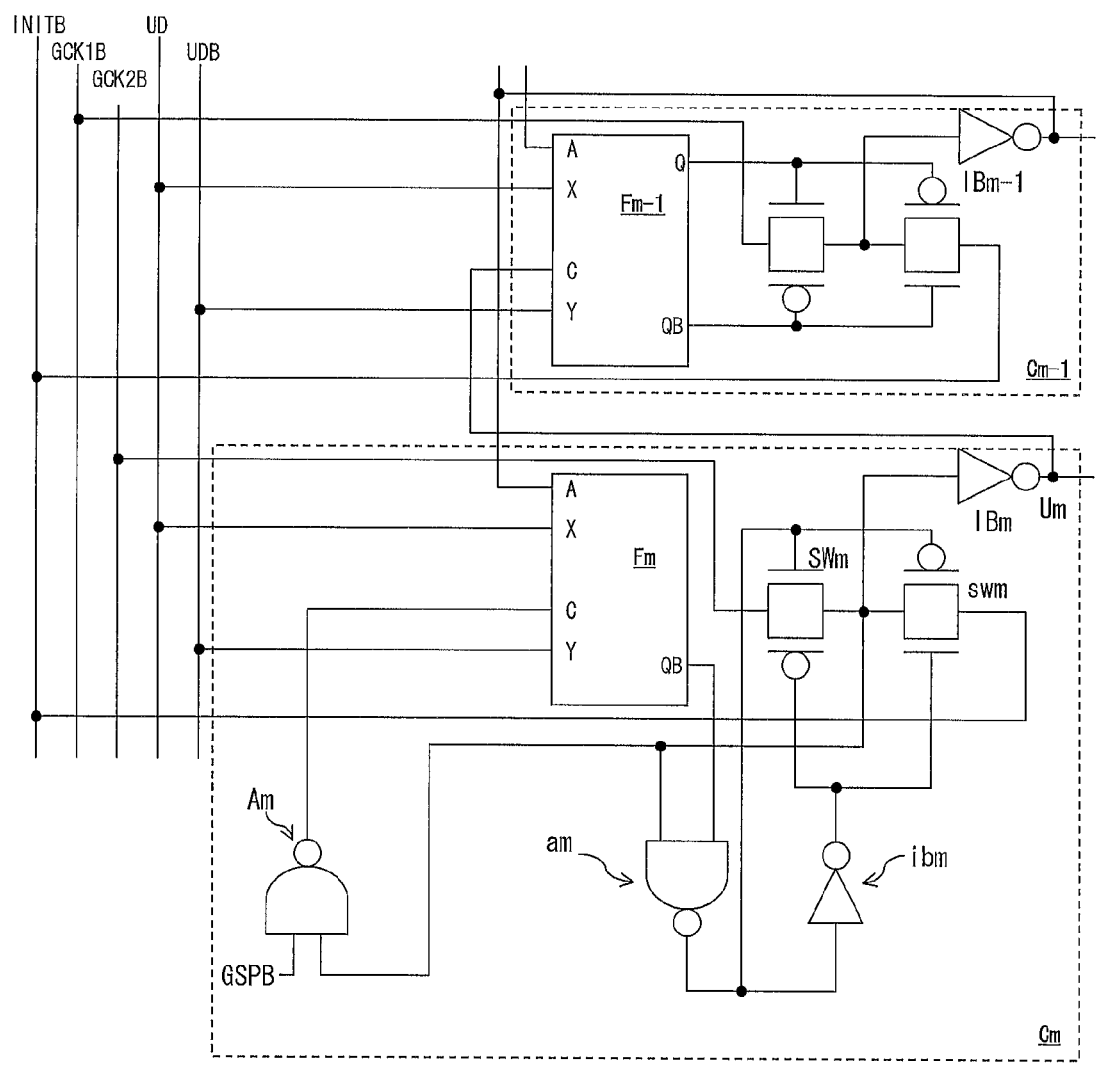
FIG. 24 is a circuit diagram illustrating a further configuration (last stage) of the gate driver in accordance with Embodiment 2.

The unit circuit C1 of the first stage shown in FIG. 21 can be modified as shown in FIG. 23, and the unit circuit Cm of the last stage shown in FIG. 22 can be modified as shown in FIG. 24. That is, the configuration of FIG. 23 is different from the configuration of FIG. 21 in that (i) an inverter ib1 and a NAND a1 are added and (ii) connections of the Q and QB terminals of the flip-flop F1 are changed. Specifically, the configuration of FIG. 23 is such that: one input terminal of the NAND circuit a1 is connected with an input terminal of the inverter IB1 of the current stage C1; the other input terminal of the NAND circuit a1 is connected with the QB terminal of the flip-flop F1; an output terminal of the NAND circuit a1 is connected with an input terminal of the inverter ib1, with the P terminal of the analog switch SW1 and with the N terminal of the analog switch sw1; and an output terminal of the inverter ib1 is connected with the N terminal of the analog switch SW1 and with the P terminal of the analog switch sw1. The Q terminal of the flip-flop F1 is closed. Similarly, the configuration of FIG. 24 is different from the configuration of FIG. 22 in that (a) an inverter ibm and a NAND am are added and (b) connections of the Q and QB terminals of the flip-flop Fm are changed. Specifically, the configuration of FIG. 24 is such that: one input terminal of the NAND circuit am is connected with an input terminal of the inverter IBm of the current stage Cm; the other input terminal of the NAND circuit am is connected with the QB terminal of the flip-flop F1; an output terminal of the NAND circuit am is connected with an input terminal of the inverter ibm, with the P terminal of the analog switch SW m and with the N terminal of the analog switch swm; and an output terminal of the inverter ibm is connected with the N terminal of the analog switch SWm and with the P terminal of the analog switch swm. The Q terminal of the flip-flop Fm is closed.

According to the configurations of FIGS. 23 and 24, when the GSPB becomes active ("L") before the start of forward shifting (see FIG. 13), an output from the NAND A1 of the first stage C1 changes from "L" to "H". That is, the A terminal of the flip-flop F1 is "H", the C terminal of the flip-flop F1 is "L", and the analog switch 11 of the flip-flop F1 is in the ON state and the analog switch 12 of the flip-flop F1 is in the OFF state. This updates the latch circuit, and the Q terminal becomes "H" and the QB terminal becomes "L" (output from the NAND a1 becomes "H", output from the inverter ib1 becomes "L", the analog switch SW1 is turned ON, and the analog switch sw1 is turned OFF). Accordingly, from this point in time (even after the GSPB has returned to "H" and the analog switch 11 has been turned OFF), this state is maintained until the next time the latch circuit LC is updated. That is, the output signal O1 rises to "H" at tp and falls back to "L" at tq.

Further, when an output signal Om−1 from a stage Cm-1 which precedes the last stage Cm becomes "H" at tx, the latch circuit of the flip-flop Fm is updated, and the Q terminal becomes "H" and the QB terminal becomes "L" (that is, output from the NAND am becomes "H", output from the inverter ibm becomes "L", the analog switch SWm is turned ON, and the analog switch swm is turned OFF). Therefore, from this point in time (even after the output signal Om−1 has become "L"), this state is maintained and an inverted version (GCK2) of the GCK2B is supplied to the driving terminal Um of the last stage Cm. Note here that, during a period during which the GCK2B is "H", the latch circuit is not updated because an output from the NAND Am is "L" (both of two inputs are "H"). When the GCK2B changes from "H" to "L" at ty, the output signal Om from the last stage Cm becomes "H", the output from the NAND Am is "H", and the analog switch 12 of the flip-flop F1 is turned ON. This updates the latch circuit, and the Q terminal becomes "L" and the QB terminal becomes "H" (output from the NAND am becomes "H", output from the inverter ibm becomes "L", the analog switch SWm is turned ON, and the analog switch swm is turned OFF). Then, when the GCK2B changes from "L" to "H" at tz, the output from the NAND am becomes "L", thereby the analog switch SWm is turned OFF and the analog switch swm is turned ON. Accordingly, the output signal Om of the last stage Cm is reset to "L". The same applies to reverse shifting.

According to the configurations of FIGS. 23 and 24, it is possible to carry out self-resetting in the stage at which the shifting ends (this stage is the last stage in the case of forward shifting, and is the first stage in the case of reverse shifting), and also to cause the pulse width of the output signal from the stage at which the shifting ends to be the same as those of the other stags (see FIG. 13).

Figure 25:
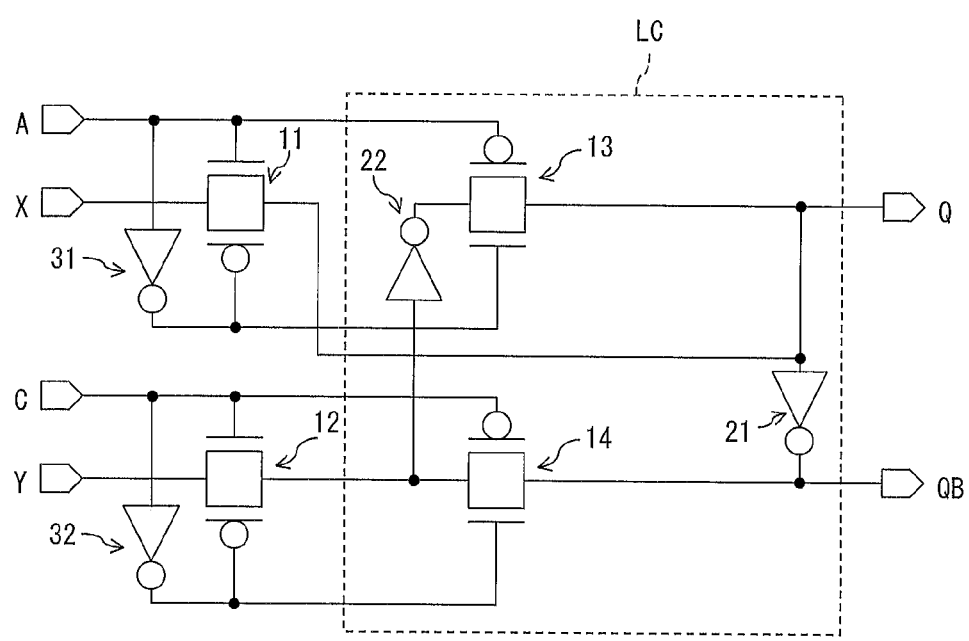
FIG. 25 is a modified example of the flip-flop shown in FIG. 20.

According to the shift register of the present embodiment, the flip-flop of each stage can be configured as shown in FIG. 25. The flip-flop Fn shown in FIG. 25 includes analog switches 11 to 14 and inverters 21, 22, 31 and 32. The flip-flop Fn is configured such that: the A terminal is connected with the N terminal of the analog switch 11 and with the P terminal of the analog switch 13; the A terminal is further connected with the P terminal of the analog switch 11 and with the N terminal of the analog switch 13 via the inverter 31; the C terminal is connected with the N terminal of the analog switch 12 and with the P terminal of the analog switch 14; the C terminal is further connected with the P terminal of the analog switch 12 and with the N terminal of the analog switch 14 via the inverter 32; the X terminal is connected with the input terminal of the inverter 21 via the analog switch 11; and the Y terminal is connected with the input terminal of the inverter 22 via the analog switch 12. The output terminal of the inverter 21 is connected with the input terminal of the inverter 22 via the analog switch 14, and the output terminal of the inverter 22 is connected with the input terminal of the inverter 21 via the analog switch 13. That is, the latch circuit LC is configured such that an output from the inverter 21 is fed back to the input terminal of the inverter 21 via the inverter 22 when the analog switches 13 and 14 are in the ON state. This achieves the following. That is, (i) when the analog switch 11 or 12 is in the ON state and the latch circuit LC is receiving the UD or the UDB, the analog switch 13 or 14 is in the OFF state so that no feedback occurs, (ii) when both the analog switches 11 and 12 are in the OFF state and the latch circuit LC is receiving neither the UD nor the UDB, the analog switches 13 and 14 are in the ON state so that feedback occurs, and (iii) when both the analog switches 11 and 12 are in the ON state, both the analog switches 13 and 14 are in the OFF state so that the inverter 21 of the latch circuit LC receives the UD (from the X terminal), the inverter 22 of the latch circuit LC receives the UDB (from the Y terminal), and no feedback occurs. According to a gate driver including the flip-flop Fn shown in FIG. 25, the UD and the UDB are the same signals (both are "H" in the case of forward shifting, and both are "L" in the case of reverse shifting) during a shifting period.

According to the shift register in which each stage (each unit circuit) includes the flip-flop Fn shown in FIG. 25, even if both the analog switches 11 and 12 are turned ON, i.e., even if the output signal On−1 from the previous stage and the output signal On+1 from the subsequent stage are made active "H" at the same time, no problem occurs such as a short circuit between the X and Y terminals of the flip-flop Fn of the current stage. This is suitable for the case where it is necessary to cause the output signals from all the stages to be active "H" before the start of shifting so that all scanning signal lines are simultaneously selected (i.e., so-called all-ON of the scanning signal lines).

The gate driver including the flip-flop Fn shown in FIG. 25 operates as shown in FIG. 16 in the case of forward shifting (from the first stage to the last stage).

First, at to before the start of shifting, the INITB signal is made active "L" and the UD is changed to "L" (the UDB is maintained at "H"). After that, at tb, the INITB signal is made non-active "H" (the UD is maintained at "L" and the UDB is maintained at "H"). After that, at tc (before the start of shifting), the UD is changed to "H" (the UDB is maintained at "H") (these operations are carried out in the case of forward shifting). This makes it possible to make sure that all-ON operation is carried out, and thus possible to initialize the shift register by supplying the UD "L" to the latch circuits LC of the flop-flops of the all the stages to thereby cause the Q terminals of the respective flip-flops to be "L".

Further, when the output signal On−1 from the previous stage becomes "H" at t0, the output signal On+1 from the subsequent stage is "L". Therefore, the A terminal of the flip-flop Fn is "H", the C terminal of the flip-flop Fn is "L", and the analog switch 11 of the flip-flop Fn is in the ON state and the analog switch 12 of the flip-flop Fn is in the OFF state. This causes the "H" of the UD to be supplied to the inverter 21 via the X terminal (refer to FIG. 25), thereby the latch circuit is updated and the Q terminal becomes "H" and the QB terminal becomes "L" (that is, the analog switch SWn is turned ON and the analog switch swn is turned OFF). This state is maintained from t0 (even after the output signal On−1 has fallen and the analog switch 11 has been turned OFF) until the next time the latch circuit LC is updated. That is, an inverted version (GCK2) of the GCK2B is supplied to the driving terminal Un of the current stage, and thus the output signal On from the current stage rises to "H" at t2 and falls to "L" at t3.

Further, when the output signal On+1 from the subsequent stage becomes "H" at t4, the output signal On−1 from the previous stage is "L". Therefore, the A terminal of the flip-flop Fn is "L", the C terminal of the flip-flop Fn is "H", and the analog switch 11 of the flip-flop Fn is in the OFF state and the analog switch 12 of the flip-flop Fn is in the ON state. This causes the "H" of the UDB to be supplied to the inverter 22 via the Y terminal (refer to FIG. 25), thereby the latch circuit is updated and the Q terminal becomes "L" and the QB terminal becomes "H" (that is, the analog switch SWn is turned OFF and the analog switch swn is turned ON). This state is maintained from t4 (even after the output signal On+1 has fallen and the analog switch 12 has been turned OFF) until the next time the latch circuit LC is updated. That is, an inverted version of the INITB "H" is supplied to the driving terminal Un of the current stage, and thus the output signal On from the current stage is "L" at and after t4.

[Each of the Embodiments]

Figure 26:
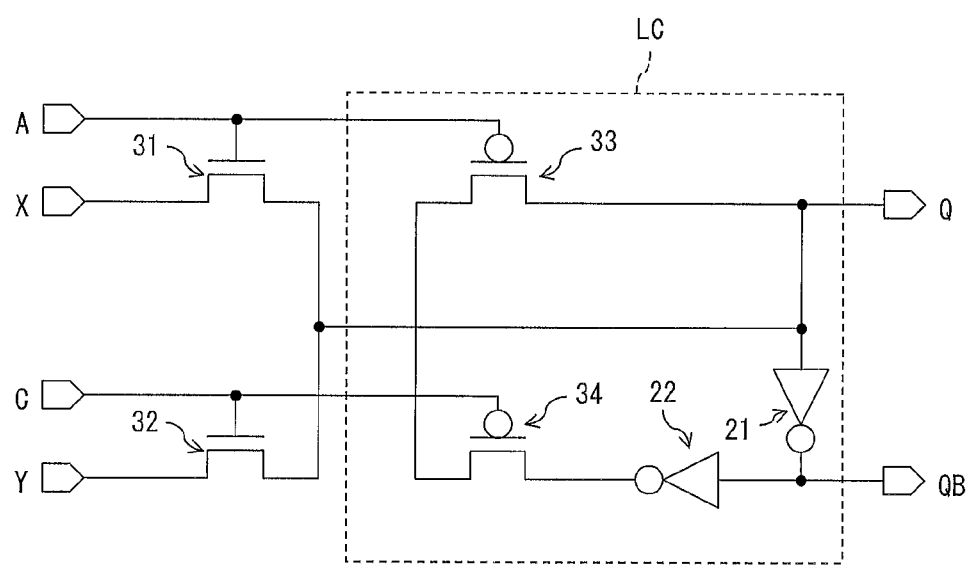
FIG. 26 is another modified example of the flip-flop shown in FIG. 20.
Figure 28:
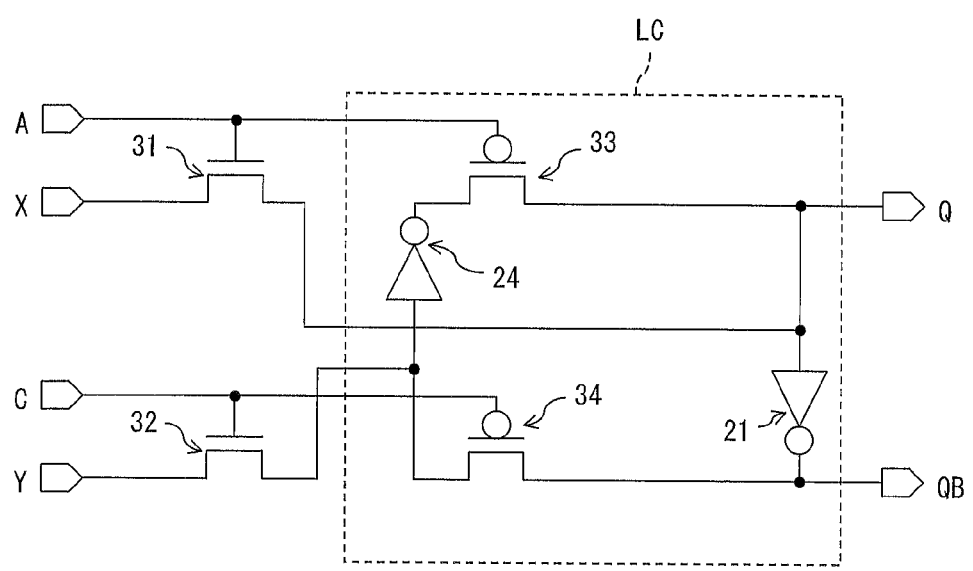
FIG. 28 is a further modified example of the flip-flop shown in FIG. 20.

The shift register of each of the embodiments can be configured as shown in FIG. 26. That is, the shift register can be configured such that: the analog switches 11 and 12 of the flip-flop Fn shown in FIG. 20 are replaced with respective N channel transistors 31 and 32; and the analog switches 13 and 14 shown in FIG. 20 are replaced with respective P channel transistors 33 and 34. Further, the shift register can be configured as shown in FIG. 28. That is, the shift register can be configured such that: the analog switches 11 and 12 of the flip-flop Fn shown in FIG. 25 are replaced with respective N channel transistors 31 and 32; and the analog switches 13 and 14 shown in FIG. 25 are replaced with respective P channel transistors 33 and 34.

Figure 27:
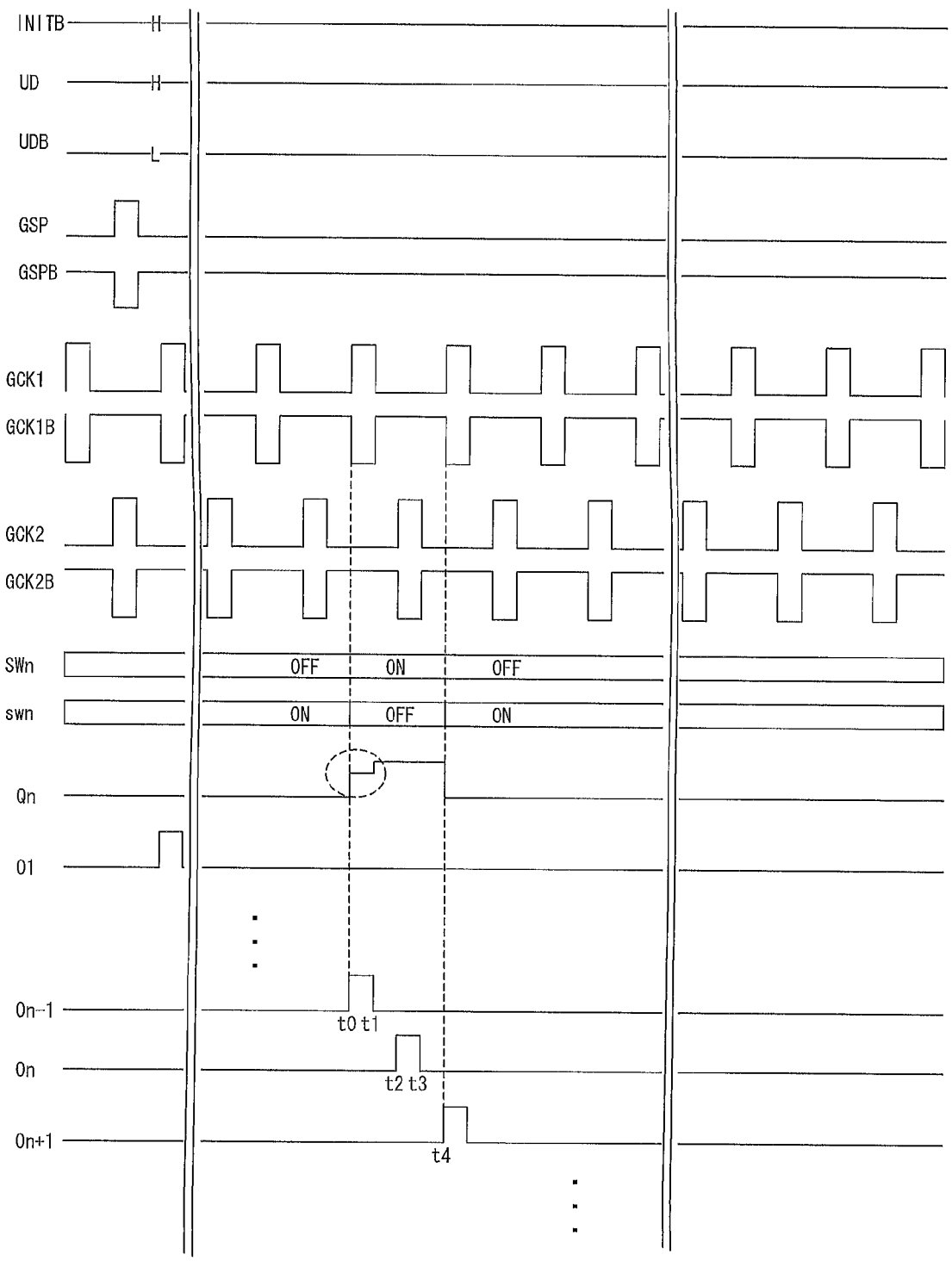
FIG. 27 is a timing chart showing operations of a gate driver including the flip-flop shown in FIG. 26 (in the case of forward shifting).
Figure 29:
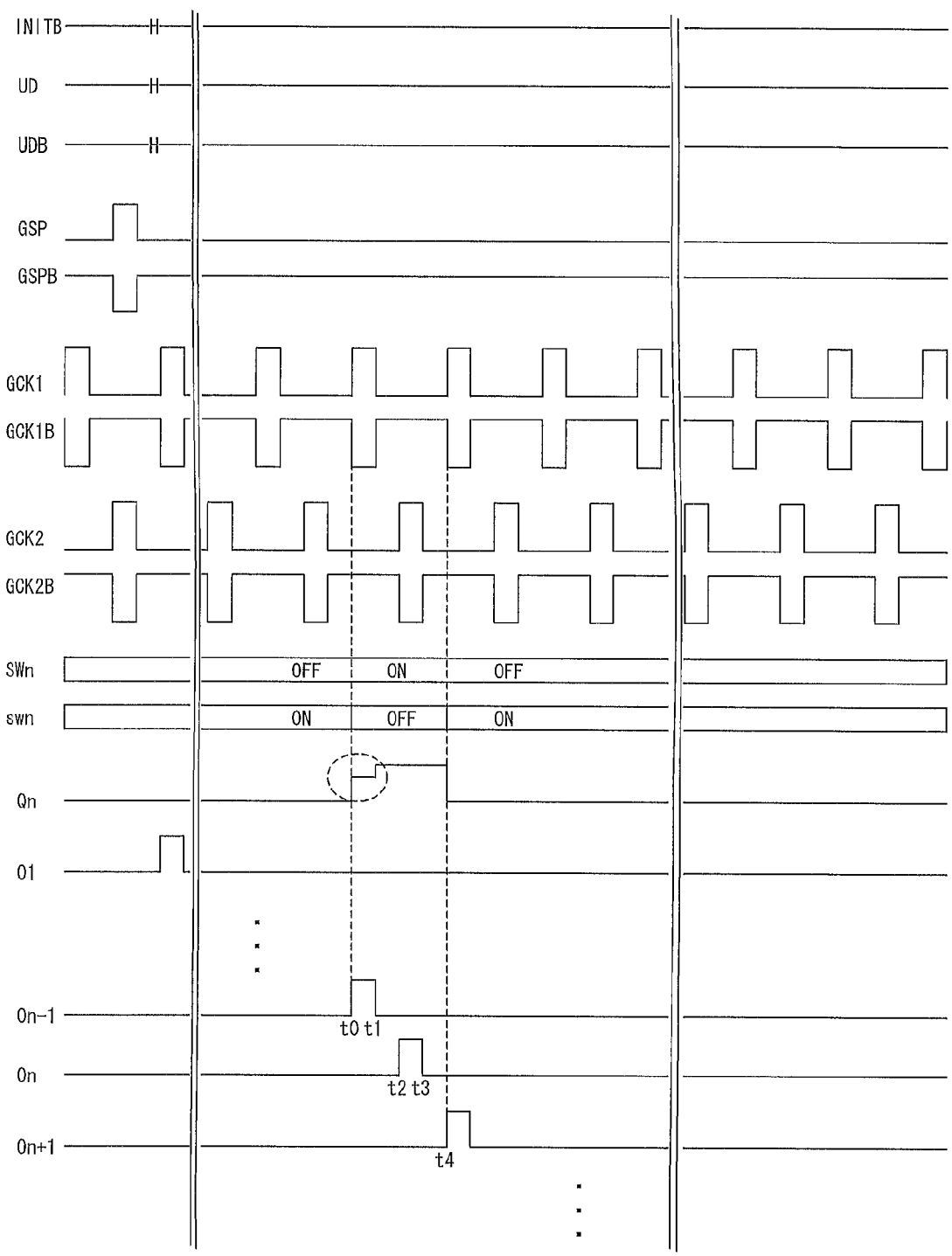
FIG. 29 is a timing chart showing operations of a gate driver including the flip-flop shown in FIG. 27 (in the case of forward shifting).

FIG. 27 shows operations of the gate driver in which the flip-flop of each stage of the shift register is configured as shown in FIG. 26. FIG. 29 shows operations of the gate driver in which the flip-flop of each stage of the shift register is configured as shown in FIG. 28. As shown in FIGS. 27 and 29, according to the configurations of FIGS. 26 and 28, during a period from t0 to t1 (during which an output from the flip-flop is active), the Q terminal of the flip-flop is not "H (voltage of high-voltage power supply)" but "voltage of the high-voltage power supply—threshold voltage of N channel transistor 31". Note that, if feedback occurs in the latch circuit LC at t1, the Q terminal is "H (voltage of high-voltage power supply)". Accordingly, in a case where there is no problem even if an output (potential of the Q terminal) from the latch circuit of the flip-flop decreases by a threshold when the latch circuit is updated, e.g., in a case where amplitudes of the GCK1B and GCK2B are much larger than those of the UD and UDB, it is possible to employ the configurations of FIGS. 26 and 28, thereby further reducing the number of elements in the flip-flop.

Figure 30:
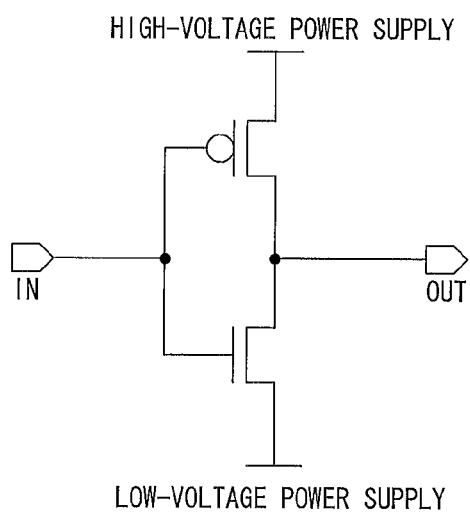
FIG. 30 is an example of how an inverter is realized.

Note that an inverter for use in each of the embodiments can be realized by for example a circuit shown in FIG. 30. That is, the inverter can be realized by a circuit configured such that: one conducting terminal of a P channel transistor, one conducting terminal of an N channel transistor and an output terminal OUT are connected with one another; the other conducting terminal of the P channel transistor is connected with the high-voltage power supply; the other conducting terminal of the N channel transistor is connected with the low-voltage power supply; and a control terminal of the P channel transistor, a control terminal of the N channel transistor and an input terminal IN are connected with one another.

A shift register of the present invention includes a plurality of stages of unit circuits each including a flip-flop, a shift direction of the shift register being switchable by a first shift direction signal and a second shift direction signal, wherein: each of the unit circuits generates, by obtaining a sync signal in accordance with an output from the flip-flop, an output signal to be outputted from a current stage, the flip-flop includes (i) a first switch and a second switch and (ii) a latch circuit for latching a signal supplied thereto and outputting the signal as the output from the flip-flop, the first shift direction signal is supplied to the latch circuit via the first switch, and the second shift direction signal is supplied to the latch circuit via the second switch, and in each unit circuit other than those of the first and last stages, an output signal from a previous stage is supplied to a control terminal of the first switch, and an output signal from a subsequent stage is supplied to a control terminal of the second switch.

According to the shift register, in the case of forward shifting, when the previous stage becomes active and thus the first shift direction signal is supplied to the latch circuit, the output from the flip-flop becomes active and is maintained active until the subsequent stage becomes active and thus the second shift direction signal is supplied to the latch circuit. On the other hand, in the case of reverse shifting, when the subsequent stage becomes active and thus the second shift direction signal is supplied to the latch circuit, the output from the flip-flop becomes active and is maintained active until the previous stage becomes active and thus the first shift direction signal is supplied to the latch circuit.

As described above, according to the configuration, it is possible to achieve, with use of less elements than a conventional technique, a shift register whose shift direction is switchable. This makes it possible to reduce the size and cost of the bidirectional shift register.

The shift register of the present invention can be configured such that: the latch circuit includes a first inverter and a second inverter; the first inverter is connected between two output terminals of the flip-flop; the first shift direction signal is supplied to the first inverter via the first switch, and the second shift direction signal is supplied to the first inverter via the second switch; and an output terminal of the first inverter is connected with an input terminal of the second inverter, and an output terminal of the second inverter is connected with an input terminal of the first inverter.

The shift register of the present invention can be configured such that: the latch circuit includes a first inverter, a second inverter, a third switch and a fourth switch, the third switch being in an OFF state when the first switch is in an ON state, and the fourth switch being in the OFF state when the second switch is in the ON state; the first inverter is connected between two output terminals of the flip-flop; the first shift direction signal is supplied to the first inverter via the first switch, and the second shift direction signal is supplied to the first inverter via the second switch; and an output terminal of the first inverter is connected with an input terminal of the second inverter, and an output terminal of the second inverter is connected with an input terminal of the first inverter via the third and fourth switches.

The shift register of the present invention can be configured such that: the latch circuit includes a first inverter, a second inverter, a third switch and a fourth switch, the third switch being in an OFF state when the first switch is in an ON state, and the fourth switch being in the OFF state when the second switch is in the ON state; the first inverter is connected between two output terminals of the flip-flop; the first shift direction signal is supplied to the first inverter via the first switch, and the second shift direction signal is supplied to the second inverter via the second switch; and an output terminal of the first inverter is connected with an input terminal of the second inverter via the fourth switch, and an output terminal of the second inverter is connected with an input terminal of the first inverter via the third switch.

The shift register of the present invention can be configured such that each of the unit circuits obtains (i) an initializing signal when the output from the flip-flop is non-active and (ii) a clock signal (sync signal) when the output from the flip-flop is active.

The shift register of the present invention can be configured such that, at a time of initialization, the output from the flip-flop is fixed at non-active and an output signal from each unit circuit other than those of the first and last stages is made active.

The shift register of the present invention can be configured such that: a unit circuit of the first stage includes a logic circuit that receives a scan start signal and an obtained signal, and an output from the logic circuit is supplied to a control terminal of the first switch; and a unit circuit of the last stage also includes a logic circuit that receives the scan start signal and an obtained signal, and an output from the logic circuit is supplied to a control terminal of the second switch.

The shift register of the present invention can be configured such that: each of the first and second switches is an analog switch in which (i) one conducting terminal of a P channel transistor is connected with one conducting terminal of an N channel transistor and (ii) the other conducting terminal of the P channel transistor is connected with the other conducting terminal of the N channel transistor; the output signal from the previous stage is supplied to one control terminal of the first switch, and an inverted version of the output signal from the previous stage is supplied to the other control terminal of the first switch; and the output signal from the subsequent stage is supplied to one control terminal of the second switch, and an inverted version of the output signal from the subsequent stage is supplied to the other control terminal of the second switch.

A signal line drive circuit of the present invention includes the foregoing shift register. Further, a liquid crystal display device of the present invention includes the signal line drive circuit.

The present invention is not limited to the foregoing embodiments. An embodiment obtained by altering the foregoing embodiments properly on the basis of common technical knowledge and an embodiment derived from a proper combination of such embodiments are encompassed in the embodiments of the invention.

INDUSTRIAL APPLICABILITY

A shift register of the present invention is suitable for a liquid crystal display device, for example.

REFERENCE SIGNS LIST

1 Liquid crystal display device
10 Shift register
11 Source driver
12 Gate driver (signal line drive circuit)
Cn Unit circuit (nth stage)
Fn Flip-flop
On Output signal from the nth stage
Gn Scanning signal line
SWn, swn Analog switch
INITB Inversion initialization signal
UD Shift direction signal
UDB Inverted shift direction signal
GCK1B First inverted clock signal (sync signal)
GCK2B Second inverted clock signal (sync signal)

The invention claimed is:
1. The shift register, comprising:
a plurality of stages of unit circuits, each including a flip-flop, a shift direction of the shift register being switchable by a first shift direction signal and a second shift direction signal, wherein
each unit circuit is configured to generate, by obtaining a sync signal in accordance with an output of the flip-flop, an output signal of current stage,
the flip-flop includes (i) a first switch and a second switch and (ii) a latch circuit configured to latch a signal supplied thereto and output the signal as the output of the flip-flop, the first shift direction signal being supplied to the latch circuit via the first switch, and the second shift direction signal being supplied to the latch circuit via the second switch,
in each unit circuit other than a first and last of the plurality of stages, an output signal of a previous stage is supplied to a control terminal of the first switch of a current stage of the plurality of stages, and an output signal of a subsequent stage of the plurality of stages is supplied to a control terminal of the second switch of the current stage,
the latch circuit includes a first inverter, a second inverter, a third switch and a fourth switch, the third switch configured to be in an OFF state when the first switch is in an ON state, and the fourth switch configured to be in the OFF state when the second switch is in the ON state,
the first inverter is connected between two output terminals of the flip-flop,
the first shift direction signal is supplied to the first inverter via the first switch, and the second shift direction signal is supplied to the first inverter via the second switch, and
an output terminal of the first inverter is connected with an input terminal of the second inverter, and an output terminal of the second inverter is connected with an input terminal of the first inverter via the third and fourth switches.

2. A shift register, comprising:

a plurality of stages of unit circuits, each including a flip-flop, a shift direction of the shift register being switchable by a first shift direction signal and a second shift direction signal, wherein each unit circuit is configured to generate, by obtaining a sync signal in accordance with an output of the flip-flop, an output signal of a current stage, the flip-flop includes (i) a first switch and a second switch and (ii) a latch circuit configured to latch a signal supplied thereto and output the signal as the output of the flip-flop, the first shift direction signal being supplied to the latch circuit via the first switch, and the second shift direction signal being supplied to the latch circuit via the second switch, in each unit circuit other than a first and last of the plurality of stages, an output signal of a previous stage is supplied to a control terminal of the first switch of a current stage of the plurality of stages, and an output signal of a subsequent stage of the plurality of stages is supplied to a control terminal of the second switch of the current stage, the latch circuit includes a first inverter, a second inverter, a third switch and a fourth switch, the third switch configured to be in an OFF state when the first switch is in an ON state, and the fourth switch configured to be in the OFF state when the second switch is in the ON state, the first inverter is connected between two output terminals of the flip-flop, the first shift direction signal is supplied to the first inverter via the first switch, and the second shift direction signal is supplied to the second inverter via the second switch, and an output terminal of the first inverter is connected with an input terminal of the second inverter via the fourth switch, and an output terminal of the second inverter is connected with an input terminal of the first inverter via the third switch.

3. A shift register, comprising:

a plurality of stages of unit circuits, each including a flip-flop, a shift direction of the shift register being switchable by a first shift direction signal and a second shift direction signal, wherein each unit circuit is configured to generate, by obtaining a sync signal in accordance with an output of the flip-flop, an output signal of a current stage, the flip-flop includes (i) a first switch and a second switch and (ii) a latch circuit configured to latch a signal supplied thereto and output the signal as the output of the flip-flop, the first shift direction signal being supplied to the latch circuit via the first switch, and the second shift direction signal being supplied to the latch circuit via the second switch, in each unit circuit other than a first and last of the plurality of stages, an output signal of a previous stage is supplied to a control terminal of the first switch of a current stage of the plurality of stages, and an output signal of a subsequent stage of the plurality of stages is supplied to a control terminal of the second switch of the current stage, a unit circuit of the first stage includes a logic circuit configured to receive a scan start signal and an obtained signal, and an output of the logic circuit is supplied to a control terminal of the first switch, a unit circuit of the last stage also includes a logic circuit configured to receive the scan start signal and an obtained signal, and an output of the logic circuit is supplied to a control terminal of the second switch.

* * * * *